US008129816B2

United States Patent
Matsuno

(10) Patent No.: US 8,129,816 B2
(45) Date of Patent: Mar. 6, 2012

(54) SEMICONDUCTOR DEVICE AND METHOD OF MANUFACTURING THE SAME

(75) Inventor: Koichi Matsuno, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 779 days.

(21) Appl. No.: 12/142,326

(22) Filed: Jun. 19, 2008

(65) Prior Publication Data

US 2008/0315325 A1    Dec. 25, 2008

(30) Foreign Application Priority Data

Jun. 20, 2007 (JP) ................................ 2007-162734
Mar. 19, 2008 (JP) ................................ 2008-71283

(51) Int. Cl.
*H01L 21/70* (2006.01)
(52) U.S. Cl. .......................... 257/506; 257/510; 257/524
(58) Field of Classification Search .................. 257/506, 257/510, 524
See application file for complete search history.

(56) References Cited

U.S. PATENT DOCUMENTS

| 6,245,637 | B1 | 6/2001 | Tsai | |
| 2003/0111708 | A1* | 6/2003 | Hwang et al. | 257/514 |
| 2005/0148155 | A1 | 7/2005 | Sato et al. | |
| 2005/0151213 | A1* | 7/2005 | Casey et al. | 257/414 |
| 2006/0079068 | A1 | 4/2006 | Sheu et al. | |
| 2006/0151855 | A1 | 7/2006 | Kiyotoshi et al. | |
| 2006/0246684 | A1 | 11/2006 | Hoshi et al. | |
| 2006/0275999 | A1 | 12/2006 | Kitamura et al. | |
| 2007/0072387 | A1* | 3/2007 | Lai et al. | 438/424 |
| 2007/0102771 | A1* | 5/2007 | Wang | 257/401 |
| 2008/0087981 | A1 | 4/2008 | Matsuno | |
| 2008/0121977 | A1* | 5/2008 | Choi et al. | 257/321 |

FOREIGN PATENT DOCUMENTS

| JP | 2004-228557 | 8/2004 |
| JP | 2006-156471 | 6/2006 |

* cited by examiner

*Primary Examiner* — N Drew Richards
*Assistant Examiner* — Jae Lee
(74) *Attorney, Agent, or Firm* — Oblon, Spivak, McClelland, Maier & Neustadt, L.L.P.

(57) ABSTRACT

A semiconductor device including a semiconductor substrate; an element isolation region formed in the substrate including trenches formed at a first depth and being filled with an element isolation insulating film; an element forming region formed on the substrate and being surrounded by the trenches; a gate electrode formed along a first direction on the element forming region via a gate insulating film, the gate electrode extending over the element insulating film filled the trenches extending along a second direction; a source/drain region having a second depth less than the first depth formed in the element forming region beside the gate electrode and having an exposed surface exposed to a trench sidewall; wherein the upper surface of the element isolation insulating film exclusive of a portion underlying the gate electrode is located at a third depth greater than the second depth and less than the first depth.

12 Claims, 18 Drawing Sheets

LEAK CURRENT CHARACTERISTICS OF pn JUNCTION

LEAK CURRENT CHARACTERISTICS OF pn JUNCTION AT VARIOUS DEPTHS OF SOG

SEMICONDUCTOR DEVICE AND METHOD OF MANUFACTURING THE SAME

CROSS-REFERENCE TO RELATED APPLICATIONS

This application is based upon and claims the benefit of priority from the prior Japanese Patent Application No. 2007-162734, filed on, Jun. 20, 2007 and Japanese Patent Application No. 2008-71283, filed on, Mar. 19, 2008 the entire contents of which are incorporated herein by reference.

FIELD

The present disclosure relates to a semiconductor device in which an active region is surrounded by element isolation region filled with coating-type oxide films and a method of manufacturing such semiconductor devices.

BACKGROUND

A typical semiconductor device such as flash memory employs STI (Shallow Trench Isolation) for element isolation to achieve increased integration. STI comprises elongate trenches formed on the semiconductor substrate which are filled with insulating films to define an isolated active region encompassed by the trenches.

JP 2006-156471 A describes STI employing two layers of insulating films for filling the element isolation trenches, where the first layer comprises a silicon oxide film comprising spin-coated polysilazane film and the second layer comprises silicon oxide film formed by HDP-CVD (High Density Plasma Chemical Vapor Deposition).

During the process of thermally treating the spin-coated polysilazane film to form the silicon oxide film, shrinking of polysilazane causes strains at the interface of polysilazane and semiconductor substrate. The semiconductor substrate suffers greater stress at portions where greater amount of polysilazane is coated; hence, strains of greater magnitude occur at such portions.

Such problem is typically observed, for instance, in peripheral circuit transistors in which the active region is surrounded by STI, and the active region is exposed to increasing amount of polysilazane. Greater stress is produced especially at the interface of the active region and the polysilazane film, providing grounds for occurrence of crystal defects and dislocation. This area is subject to even greater stress when forming a high-concentration impurity region employing LDD (Low-concentration Drain), leading to increasing possibility of dislocation.

More specifically, when forming a high-concentration impurity region taking an LDD structure in the semiconductor substrate, increased instances of crystal defects are observed at the depth of pn junction formed by ion implantation, in other words, at the depth where the impurity concentration is at its peak. Then, thermal treatment is performed to reduce crystal defects and to activate the impurity ions. The thermal treatment produces stress at the STI, more specifically at the interface of polysilazane and the active region. Thus the semiconductor substrate being subject to the above stress is susceptible to linear defects such as dislocation especially at portions affected by crystal defects. Preventive measures have been sought to suppress dislocation for eliminating grounds for increase of leak current at pn junction.

One of such measures attempted to reduce occurrence of crystal defects in the semiconductor substrate is described in Patent Publication JP 2004-228557 A. The publication discloses the approach of suppressing the occurrence of crystal defects at the region of the semiconductor substrate where impurities are introduced by ion implantation to form the source/drain region. In order to reduce occurrence of crystal defects caused by stress originating from the element isolation region, the publication takes the approach of lowering the embedded oxide film prior to ion implantation.

According to the disclosure of the above publication, the source/drain region is formed by ion implantation after the oxide film embedded in the STI is lowered by dry etching.

The negative side of this approach is that, when impurities are introduced into the semiconductor substrate by ion implantation after the embedded oxide film in the STI has been lowered, transfer of implanted ions occurs from the boundary of the semiconductor substrate and the STI where the embedded oxide film has been removed. This results in unwanted deformation of the source/drain region.

One solution to this problem may be to perform ion implantation prior to lowering of the embedded oxide film. However, this counterapproach also has a negative side in that the portion of the semiconductor substrate where impurities are introduced prior to etching maybe etched away along with the impurities by the subsequent etching. This again, results in unwanted deformation of the source/drain region.

The failure in forming the source/drain region in desired form critically affects formation of a high-concentration impurity region of LDD structure.

SUMMARY

According to an aspect of the disclosure, there is provided a semiconductor device, comprising a semiconductor substrate having an upper surface; an element isolation region including a plurality of trenches being formed in the semiconductor substrate along a first direction and a second direction crossing the first direction, the trench having a sidewall and a bottom surface located at a first depth and being filled with an element isolation insulating film; an element forming region formed on the semiconductor substrate, the element forming region being surrounded by the element isolation region; a gate electrode formed along the first direction on the element forming region via a gate insulating film, the gate electrode extending over the element insulating film filled in the trenches extending along the second direction; a source/drain region formed in a portion of the element forming region located beside the gate electrode; the source/drain region having a second depth less than the first depth, and having an exposed surface exposed to the sidewall of the trench; wherein an upper surface of the element isolation insulating film exclusive of a portion underlying the gate electrode is located at a third depth greater than the second depth and less than the first depth so that the exposed surface of the source/drain region does not contact the element isolation insulating film.

According to an aspect of the disclosure, there is provided a method of manufacturing a semiconductor device, comprising forming a gate electrode on an element forming region of a first conductive-type semiconductor substrate via a gate insulating film; forming a trench surrounding the element forming region; filling the trench with a coating-type oxide film to form an element isolation region; introducing impurities having a first concentration in the element forming region to form a low-concentration impurity region having a second conductive type opposite of the first conductive type; forming a spacer on the gate electrode for forming a lightly doped drain structure; introducing impurities having a second concentration greater than the first concentration by ion implantation using the gate electrode and the spacer as mask to form a high-concentration impurity region; wet etching the coating-type oxide film filled in the trench to a depth greater than a peak depth where a peak impurity concentration of the high-concentration impurity region is located; thermally treating the impurities for ion activation; and forming a non coating-type oxide film on the coating-type oxide film.

BRIEF DESCRIPTION OF THE DRAWINGS

Other objects, features and advantages of the present disclosure will become clear upon reviewing the following description of the embodiment of the present disclosure with reference to the accompanying drawings, in which.

DETAILED DESCRIPTION

One exemplary embodiment of the present disclosure will be described with reference to FIGS. 1 to 16. The present exemplary embodiment employs the present disclosure to LDD (Lightly Doped Drain) transistors typically formed in a peripheral circuit section of NAND flash memory. References are made to the drawings hereinafter with identical or similar reference symbols when referring to identical or similar elements. Of note is that the drawings are merely schematic and the relation between the thickness and the planar dimensions and the ratios in thickness of each layer differs from the actual ratios.

Figure 1:
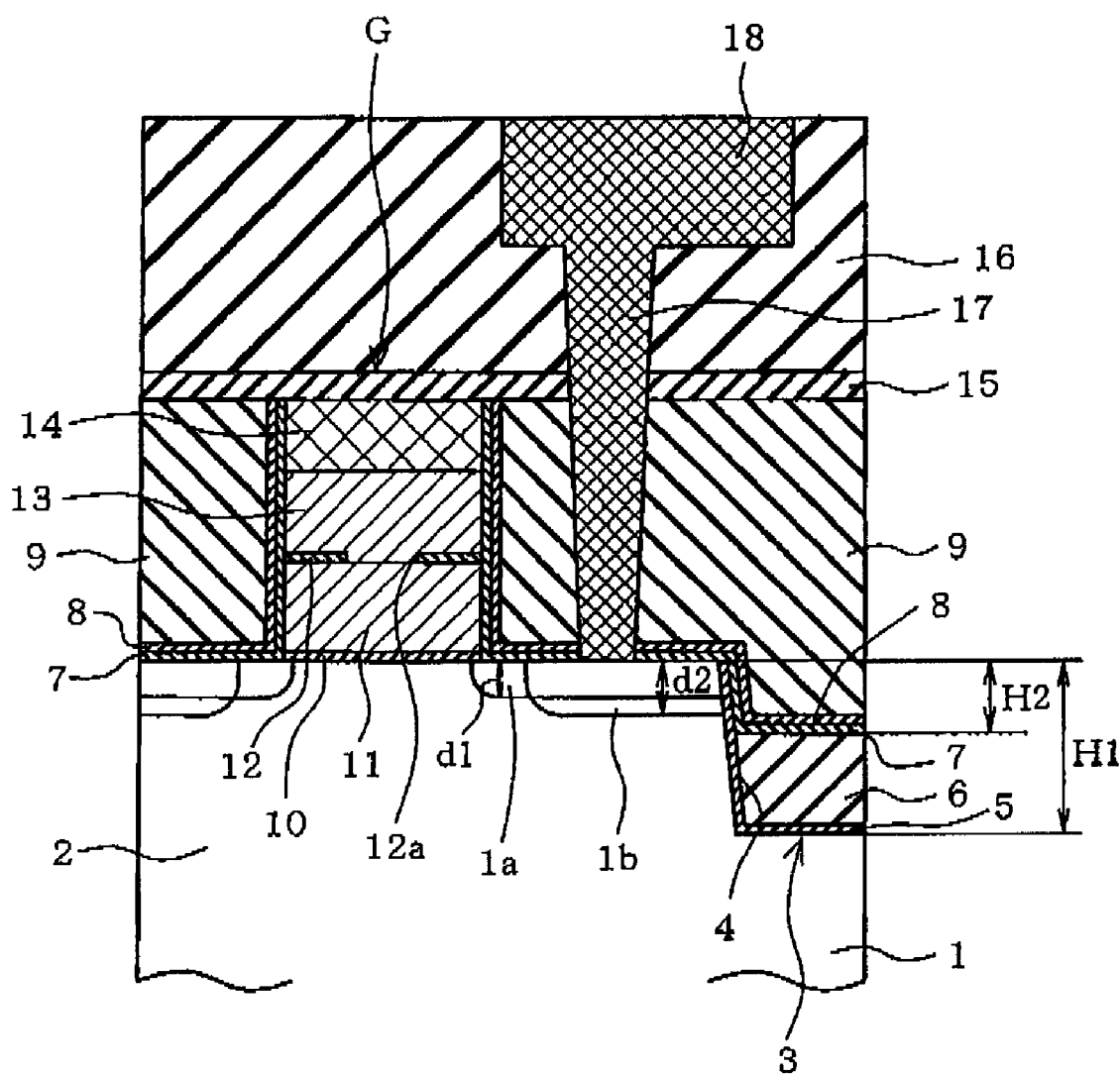
FIG. 1 is a schematic cross sectional view depicting a first exemplary embodiment of the present disclosure.
Figure 2:
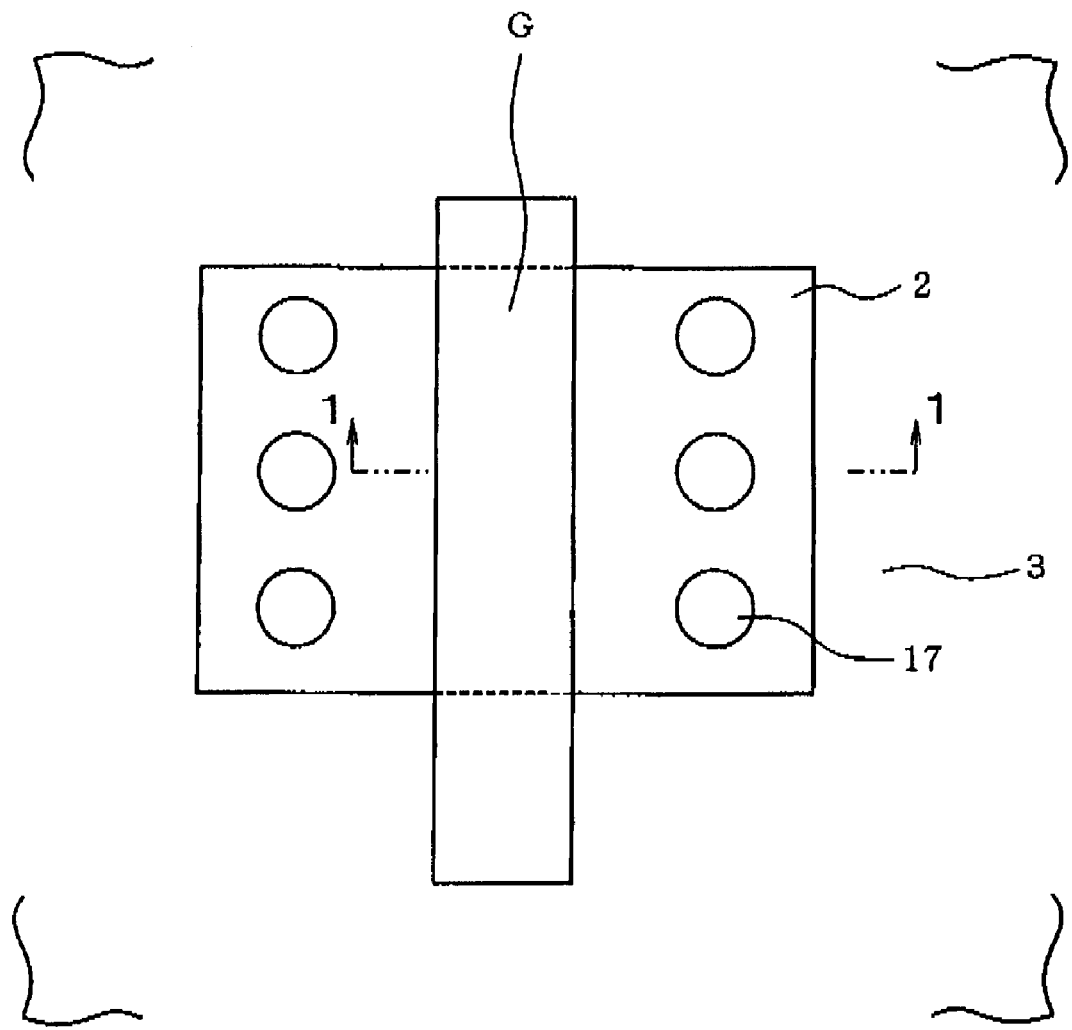
FIG. 2 is a schematic plan view.

The configuration of the transistor of the present exemplary embodiment will be described with reference to FIGS. 1 and 2. FIGS. 1 and 2 respectively illustrates a schematic vertical cross-sectional view and a planar view of a peripheral circuit transistor employed in NAND flash memory. FIG. 1 corresponds to the cross section taken along line 1-1 of FIG. 2.

A semiconductor substrate comprising a p-type silicon substrate 1 is provided with an element forming region constituting an active region 2 which is surrounded by an element isolation region 3 formed as an STI (Shallow Trench Isolation). Element isolation region 3 comprises a trench 4 formed in silicon substrate 1, an HTO (High Temperature Oxide) film 5 formed along the inner surface of trench 4, and a coating-type oxide film comprising an SOG (Spin On Glass) film 6 serving as an element isolation film formed on the HTO film 5. Trench 4 is formed so that its bottom surface is located at depth H1 from the upper surface of silicon substrate 1. Trench 4 is filled with SOG film 6 such that the upper surface of SOG film 6 is located at a predetermined elevation from the bottom surface of trench 4, in other words, such that upper surface of SOG film 6 is located at depth H2 less than depth H1 from the upper surface of silicon substrate 1. SOG film 6 comprises a polysilazane film, for example, which is converted into an oxide film by thermally treating the coated polysilazane solution. On the upper surface of SOG film 6, a TEOS (tetraethyl orthosilicate) oxide film 7 of predetermined thickness and further a silicon nitride film 8 are formed to constitute laminated layers. Trench 4 is filled with BPSG film 9 such that BPSG film 9 overflows above trench 4.

Referring to FIG. 2, a gate electrode G is formed so as to vertically cross over active region 2. Gate electrode G is formed on silicon substrate 1 via gate insulating film 10. Gate electrode G comprises laminated layers of a polycrystalline film 11, an inter-gate insulating film 12, a polycrystalline silicon film 13, and cobalt silicide ($CoSi_2$) film in listed sequence from the lowermost layer. Gate electrodes G of the peripheral circuit transistors and gate electrodes of the memory cell transistors are formed simultaneously in the same step. Gate electrode G has an opening 12a defined in inter-gate insulating film 12 for shorting the underlying polycrystalline silicon film 11 and the overlying polycrystalline silicon film 13. Polycrystalline silicon film 11 and Polycrystalline silicon film 13 respectively correspond to the floating gate electrode and the control gate electrode of the memory cell transistor.

On the surface layer of active region 2, a source/drain region of LDD structure is formed entirely across active region 2 except for the area below gate electrode G. The source/drain region is an n-type impurity diffusion region of an opposite conductive type to silicon substrate and comprises a low-concentration impurity region 1a of a first concentration and a high-concentration impurity region 1b of a second concentration greater than the first concentration. One end of low-concentration impurity region 1a extends below gate electrode G to overlap with gate electrode G by a predetermined width. One end of high-concentration impurity region 1b is spaced by predetermined width from the sidewall of gate electrode G. The depth of high-concentration impurity region 1b measured from the upper surface of silicon substrate 1, stated differently, the depth where peak concentration is located in the impurity distribution, stated still differently, depth d2 where pn junction is located is greater than depth d1 of low-concentration impurity region 1a (the depth where peak concentration is located in impurity distribution or the depth where pn junction is located). High-concentration impurity region 1b is formed along gate electrode G and along the direction orthogonal to gate electrode G until reaching the edge of active region 2 while maintaining its constant depth d2. Likewise, low-concentration impurity region 1a is formed along gate electrode G and along the direction orthogonal to gate electrode G until reaching the edge of active region 2 while maintaining its constant depth d1 Thus, low-concentration impurity region 1a and high-concentration impurity region 1b are exposed at each sidewall situated at the boundary of active region 2 and element isolation region 3.

Depth d2 of high-concentration impurity region 1b of active region 2 is less than depth H2 where the upper surface of SOG film 6 embedded in the neighboring element isolation region 3 is located.

Formed on the sidewalls of gate electrode G and on the upper surface of active region 2, are laminated layers of TEOS oxide film 7 and silicon nitride film 8 which were also formed on the upper surface of SOG film 6 of element isolation region 3. BPSG film 9 is further formed on the upper surface of the laminated layers up to the height of gate electrode G.

On the upper surface of gate electrode G and on the upper surface of BPSG film 9, a silicon nitride film 15 is formed to serve as an etch stopper. Then, on the upper surface of silicon nitride film 15, an interlayer insulating film 16 is laminated. Then, through interlayer insulating film 16, silicon nitride film 15, BPSG film 9, silicon nitride film 8 and TEOS oxide film 7, a contact hole is defined which is filled with a contact plug 17. Then the upper portion of contact plug 17 is electrically connected to a wiring layer whereas the lower portion of contact plug 17 is placed in contact with high-concentration impurity region 1b of the source/drain region.

The transistor, being configured as described above, has formed in its element isolation region 3 adjacent to active region 2, lowered SOG film 6 located at a predetermined depth H2 which is greater than the depth d2 of high-concentration impurity region 1b of LDD structure. Thus, no contact is established between pn junction of high-concentration impurity region 1b exposed at the sidewalls of active region 2 and SOG film 6, thereby suppressing the influence of stress originating from shrinking of SOG film 6 affected on high-concentration impurity region 1b. Hence, dislocation occurring in silicon substrate 1 by stress originating from crystal defects can be suppressed while reducing leak current and suppressing occurrence of other device errors originating from dislocation at the same time.

No contact is established between pn junction of low-concentration impurity region 1a exposed on the sidewalls of active region 2 and SOG film 6 as well. Hence, above described effects can be obtained at improved levels.

Figure 3:
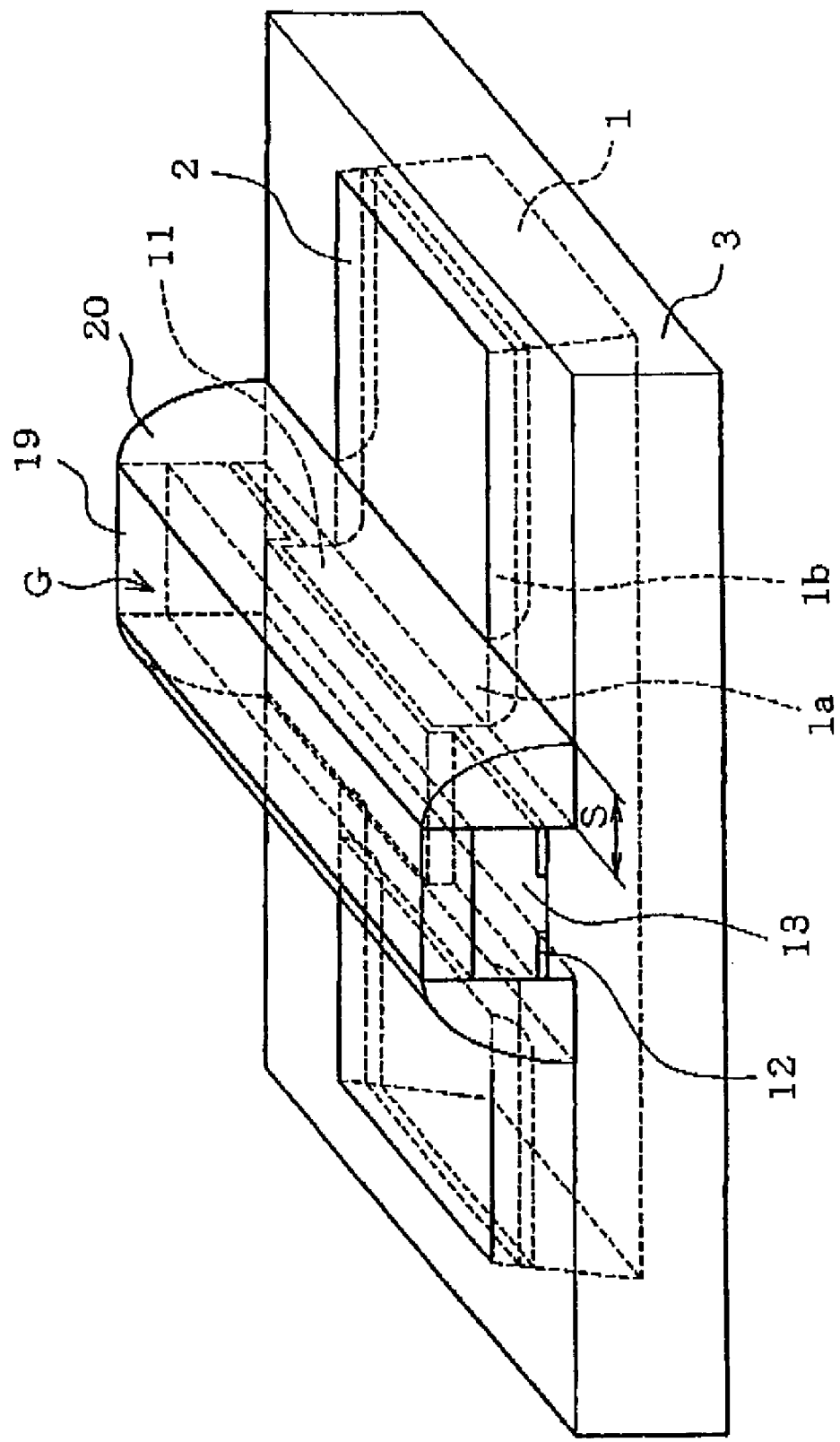
FIG. 3 schematically depicts one phase of the manufacturing steps in three-dimension.
Figure 4:
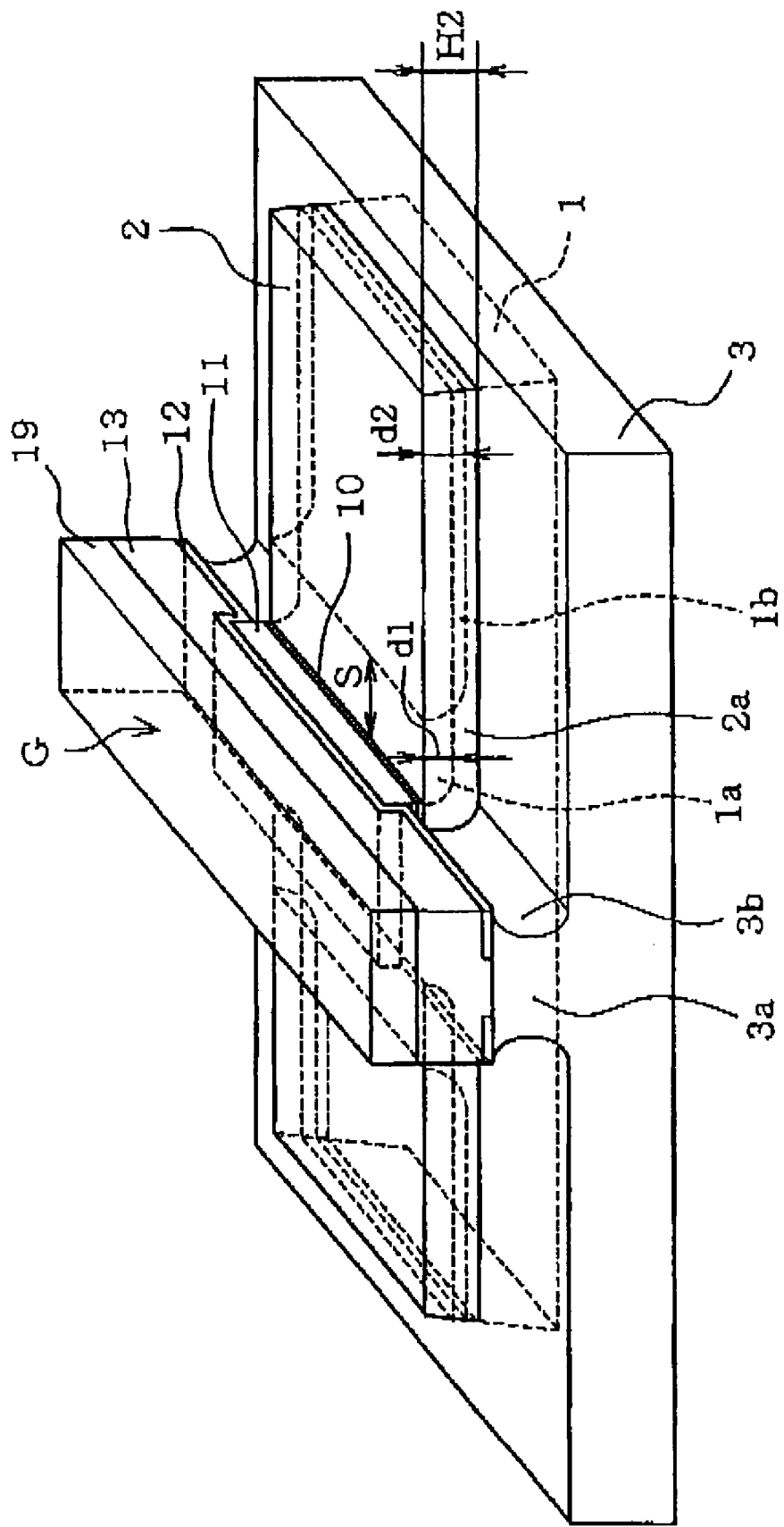
FIG. 4 schematically depicts one phase of the manufacturing steps in three-dimension.

Next, the manufacturing steps of the above described configuration will be described with reference to FIGS. 3 to 15. FIGS. 3 and 4 illustrate schematic three-dimensional views of one phase in the manufacturing steps for portions that provide the above described favorable effects. FIGS. 5 to 15 schematically illustrate configurations corresponding to the portion shown in FIG. 1 at each phase of the manufacturing steps.

Figure 5:
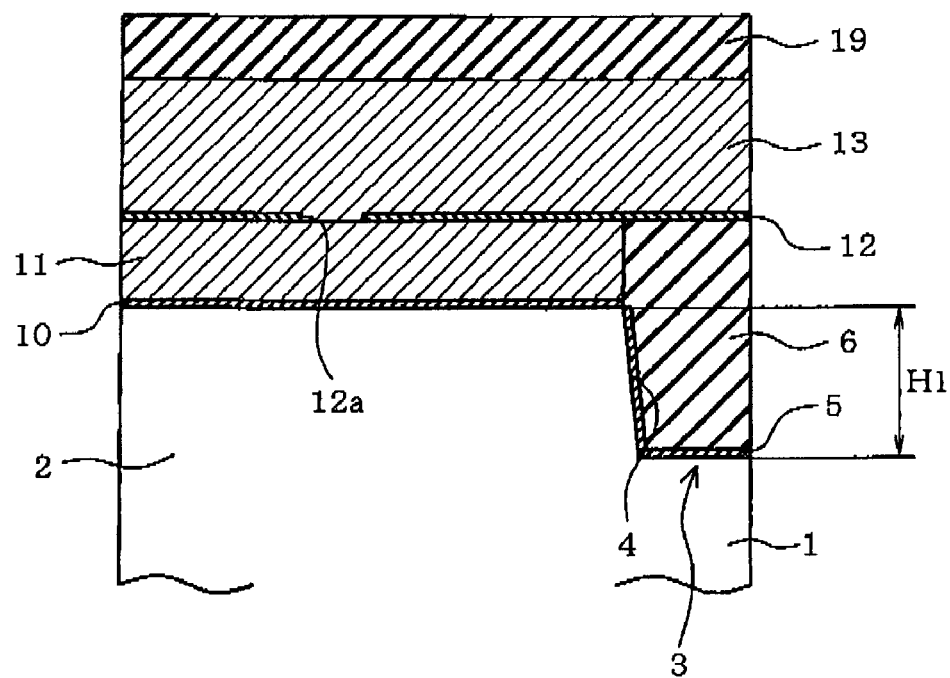
FIG. 5 schematically depicts one phase of the manufacturing steps.

Referring to FIG. 5, first, gate insulating film 10 of predetermined thickness is formed on silicon substrate 1. Then, polycrystalline silicon film 11 constituting the floating gate electrodes in the memory cell transistors and constituting the lower electrodes in the peripheral circuit transistors are formed subsequently over gate insulting film 10. Then, on the upper surface of polycrystalline silicon film 11, hard mask material (not shown) such as silicon nitride film is deposited. Then a resist is formed on the silicon nitride film and is thereafter patterned by lithography to serve as a mask for processing the silicon nitride film into a hard mask. The silicon nitride film being processed into hard mask is used to process polycrystalline silicon film 11, silicon oxide film 10, and silicon substrate 1 by RIE (Reactive Ion Etching) to form a trench 4 having a depth of H1 from the upper surface of silicon substrate 1.

Next, on the inner walls of trench 4, an PTO film 5 is formed which is thereafter coated by polysilazane, in the amount to fill the trench 4, for subsequent formation of SOG film 6. Then, by thermal treatment in an oxidative atmosphere of 400 to 500 degrees Celsius, polysilazane is converted into silicon oxide film to form SOG film 6. Then, using the aforementioned silicon nitride film as a stopper, SOG film 6 is planarized by CMP (Chemical Mechanical Polishing) so it does not remain overflown from trench 4.

Then, SOG film 6 is etched back at a thickness corresponding to the thickness of the silicon nitride film which served as CMP stopper. Then, the silicon nitride film itself is removed to provide a flush surface on which insulating film 12 is formed that constitutes the inter-gate insulating film for memory cell transistors. Insulating film 12 comprises films such as an ONO (Oxide-Nitride-Oxide) film or high-k dielectric film including materials such as alumina oxide. Inter-gate insulating film 12, though indispensable in memory cell transistors of non-volatile memory employing floating gates, is not required in the peripheral circuit transistors and thus, an opening 12a is formed on it by photolithography process. Then, over the inter-gate insulating film 12 and opening 12a, polycrystalline silicon film 13 is formed that constitutes the upper electrode. At this instance, polycrystalline silicon film 13 is electrically shorted with polycrystalline silicon film 11 via opening 12a. On the upper surface of polycrystalline silicon film 13, silicon nitride film 19 used as a mask for processing gate electrode G is formed to obtain the configuration illustrated in FIG. 5.

Figure 6:
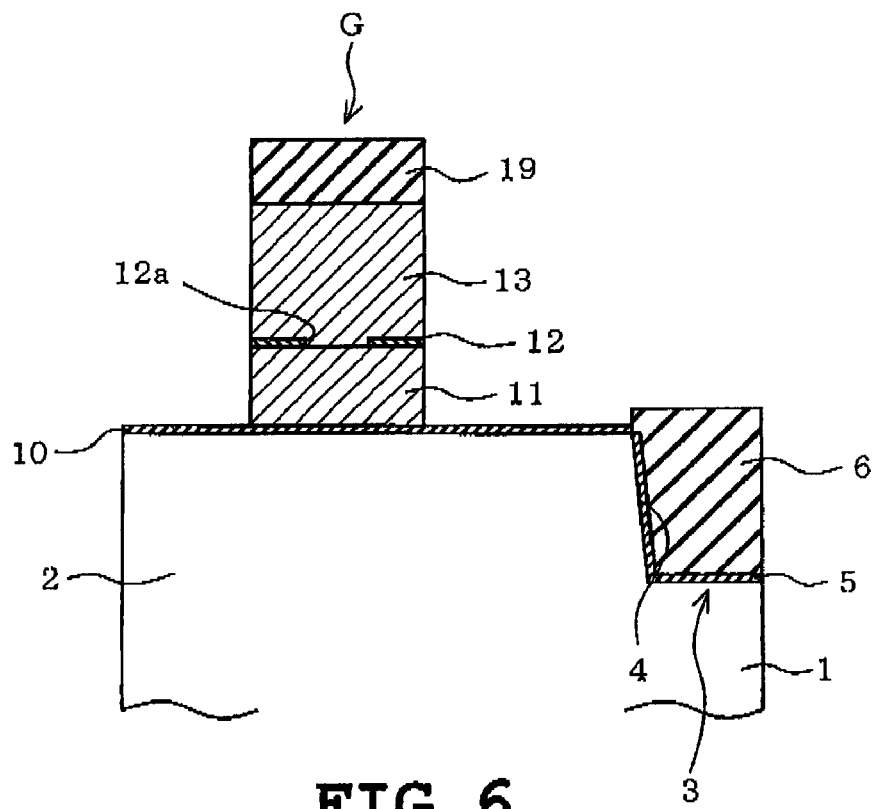
FIG. 6 schematically depicts one phase of the manufacturing steps.

Next, referring to FIG. 6, gate electrode G is patterned by photolithography and RIE. Silicon nitride film 19, being etched into a hard mask, is used for etching polycrystalline silicon film 13, inter-gate insulating film 12, and polycrystalline silicon film 11. At this time, SOG film 6 is also etched back so that its upper surface is situated almost at level with the upper surface of silicon substrate 1.

Figure 7:
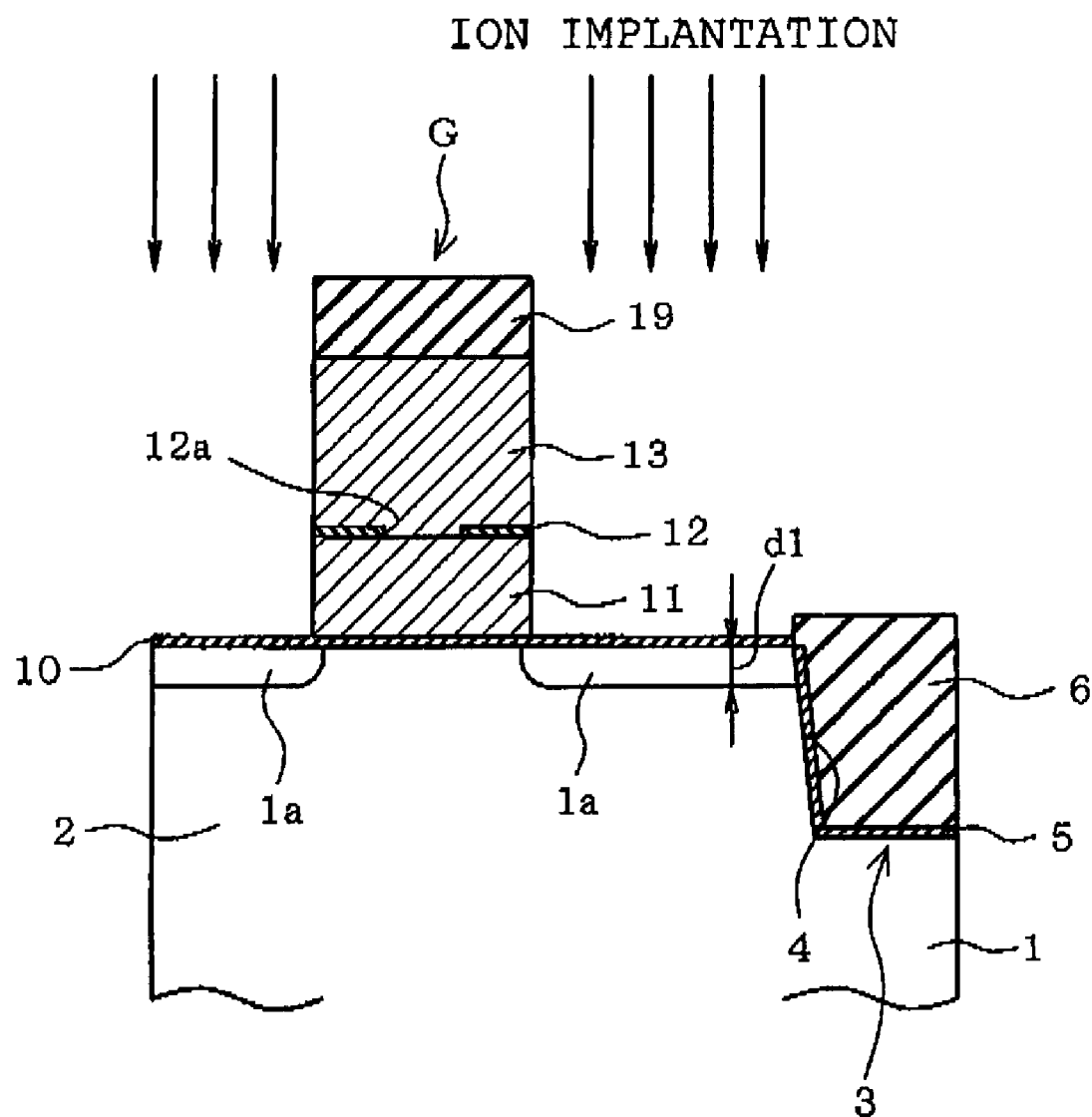
FIG. 7 schematically depicts one phase of the manufacturing steps.

Then, referring to FIG. 7, ion implantation of n-type impurities are carried out, using gate electrode G and SOG film 6 in element isolation region 3 as a mask. Thus, an n-type low-concentration impurity region 1a having a first concentration of n-type dopant is formed, having a peak depth of impurity distribution at depth d1 from silicon substrate 1 surface. Low-concentration impurity region 1a provides basis for source/drain region of LDD structure. In FIG. 7, impurity distribution peaks at the boundary between low-concentration impurity region 1a and silicon substrate 1.

Figure 8:
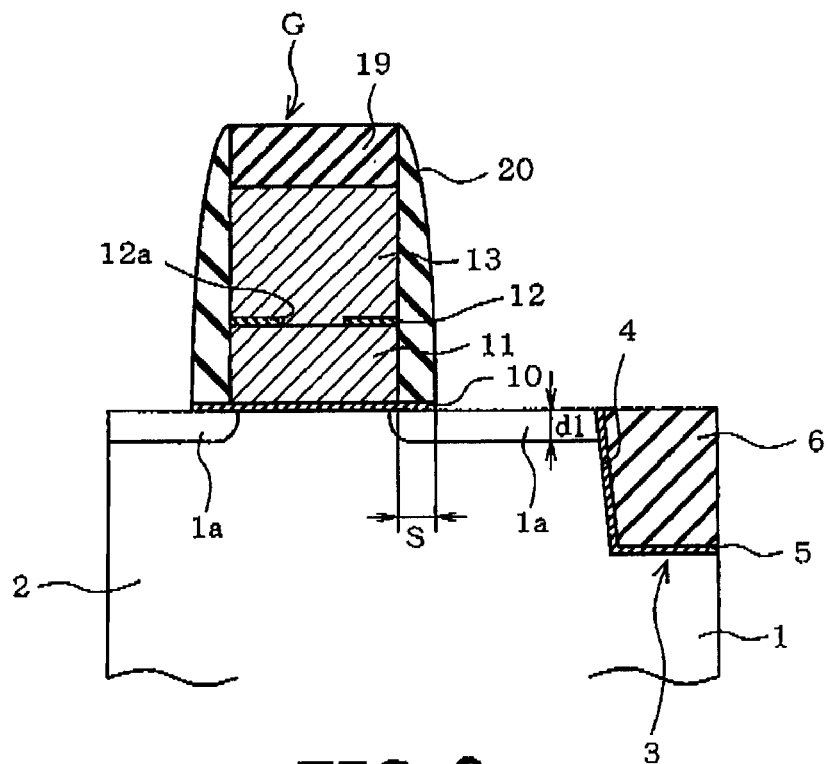
FIG. 8 schematically depicts one phase of the manufacturing steps.

Next, referring to FIG. 8, on the sidewalls of gate electrode G, spacer 20 is formed that interfaces with active region 2, the interface having width S. Then, TEOS oxide film is formed linearly across the entire surface by LP-CVD (Low Pressure Chemical Vapor Deposition) which is subsequently etched back by RIE.

Figure 10:
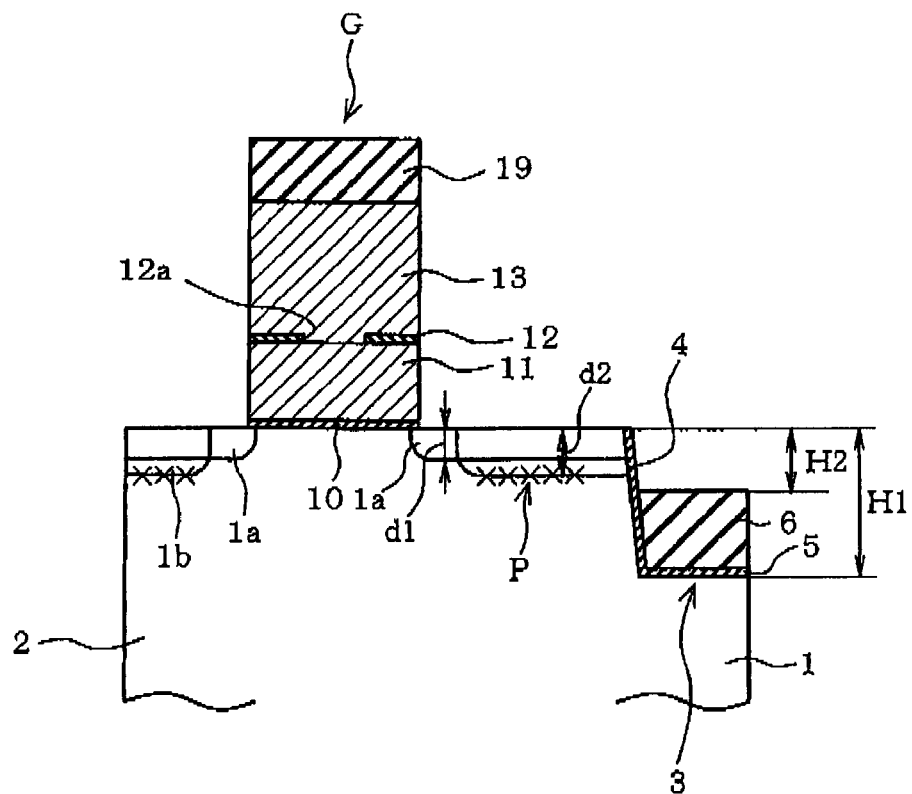
FIG. 10 schematically depicts one phase of the manufacturing steps.

Using spacer 20 as a mask, a high-concentration impurity region 1b having a second concentration of n-type dopant, greater than the first concentration, is formed entirely in active region 2 with the exception of the region below gate electrode G and spacer 20. One end of high-concentration impurity region 1b is spaced apart from gate electrode G by width S of spacer 20. Further, ion implantation is carried out so that peak concentration of impurity distribution of high-concentration impurity region 1b is located at depth d2 from the upper surface of silicon substrate 1 greater than depth 1 of low-concentration impurity region 1a. In FIG. 8, peak concentration of impurity distribution is located at the boundary between high-concentration impurity region 1a and silicon substrate 1. Silicon residing in ion implanted regions are transformed into amorphous state by ion damaging. Depths d1 and d2 indicating the location of peak concentration of impurity distribution are dependent upon parameters such as types of ions implanted, amount implanted, and acceleration voltage. As can be seen in FIG. 10, point defects P are prone to occur at depth d2.

Figure 9:
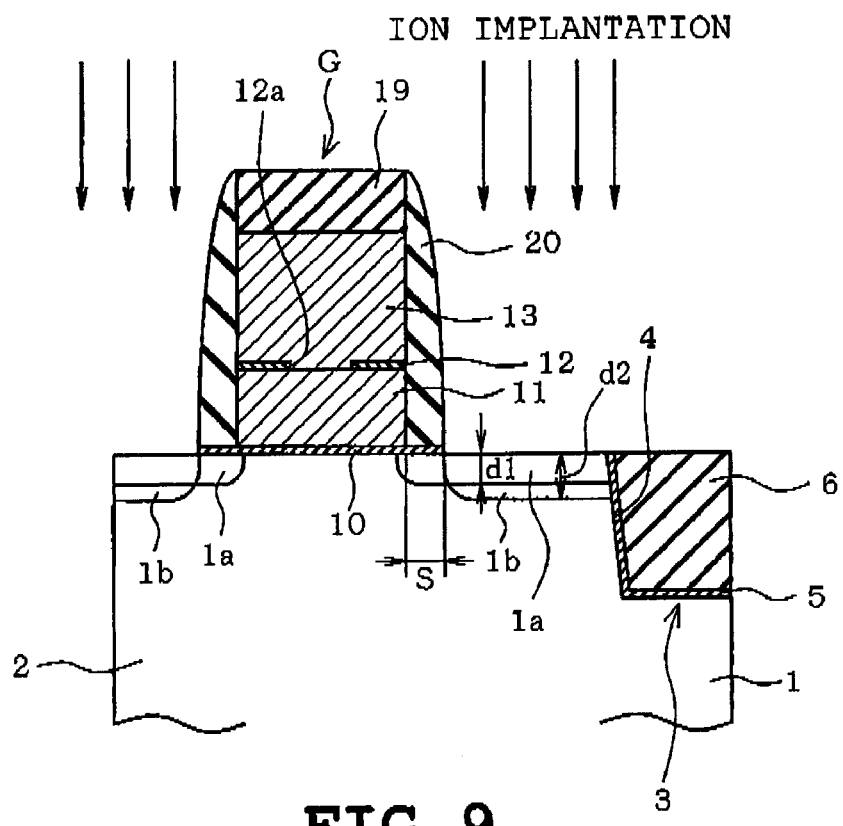
FIG. 9 schematically depicts one phase of the manufacturing steps.

FIG. 3 illustrates in three dimensions the configuration indicated in FIG. 9 in which active region 2 of silicon substrate 1 is surrounded by element isolation region 3. Gate electrode G under fabrication has spacers 20 formed on its sidewalls. One end of high-concentration impurity region 1b is situated along the outer side of spacer 20. Width S of spacer 20 at the interface with silicon substrate 1 is substantially equal to the spacing in which high-concentration impurity region 1b is retracted from low-concentration impurity region 1a.

Next, referring to FIG. 10, a resist is formed and patterned by lithography process to cover the regions where memory cell transistors are formed (not shown) and to expose the regions where peripheral circuit transistors are formed. Using the resist as a mask, the upper surface of SOG film 6 is etched down to depth H2 from silicon substrate 1 surface by wet etching using fluorinated solution. Depth H2 is configured at greater depth than depth d2 where the peak concentration of impurity distribution of high-concentration impurity region 1b is located. The wet etching also removes spacer 20 and SOG film 6 situated below spacer 20.

FIG. 4 illustrates in three dimension the configuration obtained after wet etching. As can be seen in FIG. 4, in addition to SOG film 6 being etched down to depth H2 and spacer 20 being removed by etching as described earlier, SOG film 6 situated below spacer 20 in element isolation region 3 is also etched. Further, wet etching causes progression of side etch at SOG film 6 formed in the region below gate electrode G as can be seen in FIG. 4, where the sidewalls of SOG film 6 are partially etched away. Thus, both low-concentration impurity region 1a and high-concentration impurity region 1b are not placed in direct contact with SOG film 6 at their interfaces with element isolation region 3. In other words, exposed surfaces at sidewalls of both low-concentration impurity region 1a and high-concentration impurity region 1b do not contact SOG film 6.

Figure 16A:
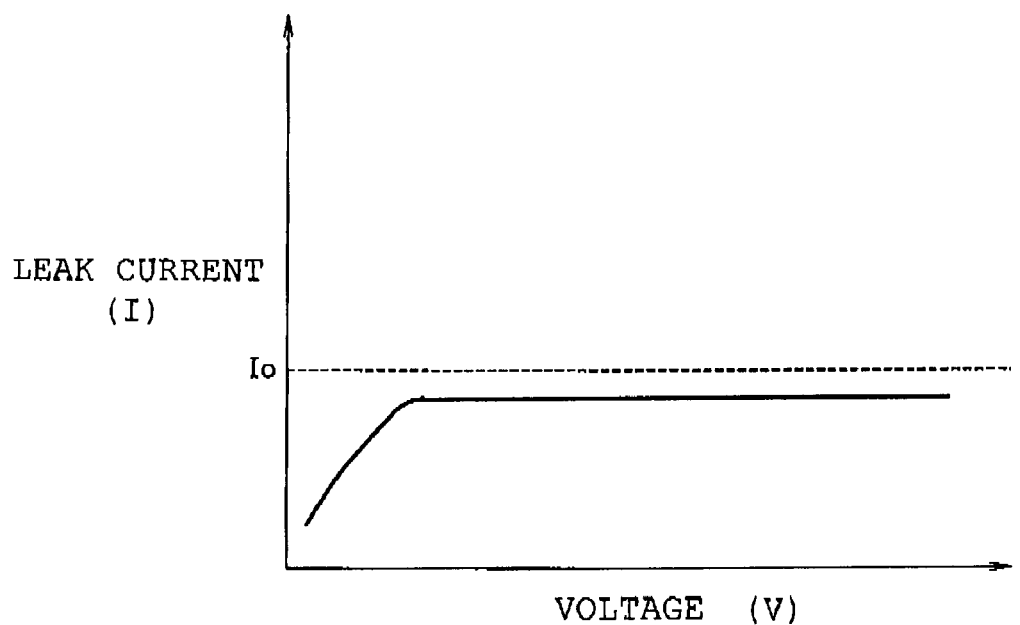
FIG. 16A depicts leak current characteristics at pn junction of a high-concentration impurity region.

Next, impurities introduced in low-concentration impurity region 1a and high-concentration impurity region 1b by ion implantation are treated by RTA (Rapid Thermal Annealing) to activate the impurity ions and for recovery of damaged crystals. Source/drain region of LDD structure is formed in active region 2 by the steps described above. Thus, the influence of strong stress produced by SOG film 6 can be reduced during thermal treatment since SOG film 6 is lowered away from impurity diffusion regions 1a and 1b as described above. As a result, dislocation originating from RTA can be suppressed to maintain a fair level of pn junction leak current characteristics and satisfy the standard Io of junction leak current as indicated in FIG. 16A.

Figure 16B:
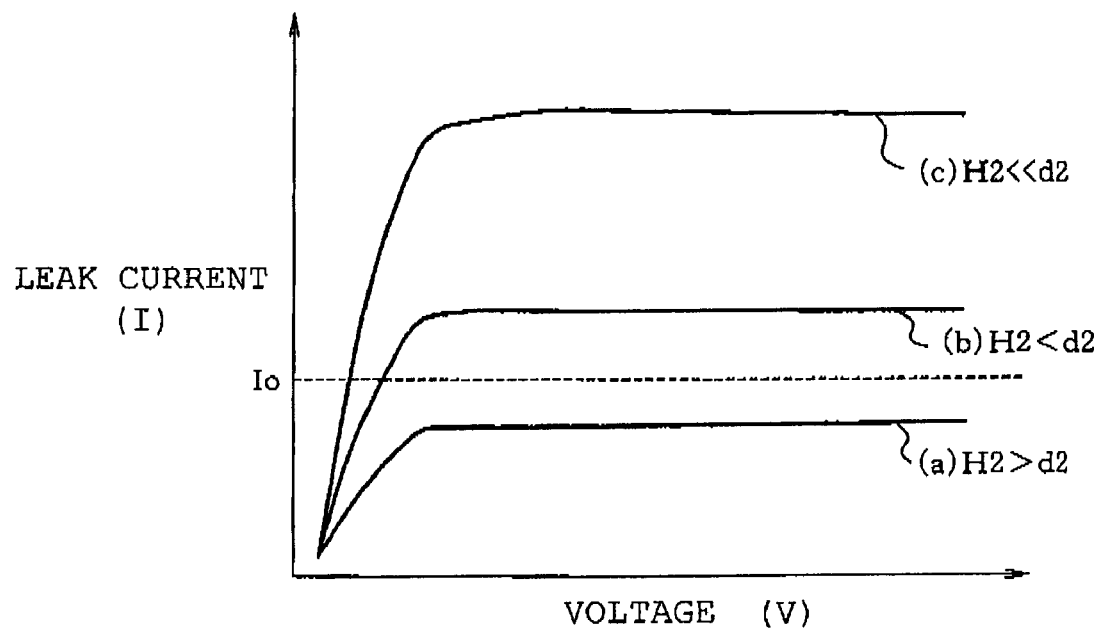
FIG. 16B depicts leak current characteristics of the high-concentration impurity region at various lowered depths of SOG film.

The inventors have verified that characteristics of pn junction leak current is greatly affected by depth H2 indicating the lowering of SOG film 6, more specifically, by the depth of H2 relative to depth d2 of high-concentration impurity region 1b. FIG. 16B indicates the measurement of pn junction leak current characteristics at different values of depth H2. According to FIG. 16B, when (a) H2>d2, that is when depth H2 to which SOG film 6 is lowered is greater than depth d2 of high-concentration impurity region 1b, pn junction leak characteristics satisfies standard Io, and as depth H2 becomes smaller than d2, (b) H2<d2 and (c)H2<<d2, pn junction leak current is increased. Case (c) H2<<d2 corresponds to the conventional configuration where SOG film 6 is not lowered.

To be precise, the pn junction of low-concentration impurity region 1a and high-concentration impurity region 1b formed by annealing (RTA in the present exemplary embodiment) is located at slightly greater depth than d1 and d2 where peak concentration of impurity distribution is located. Thus, the upper surface of SOG film 6 may be lowered at greater depth than the pn junction.

Figure 11:
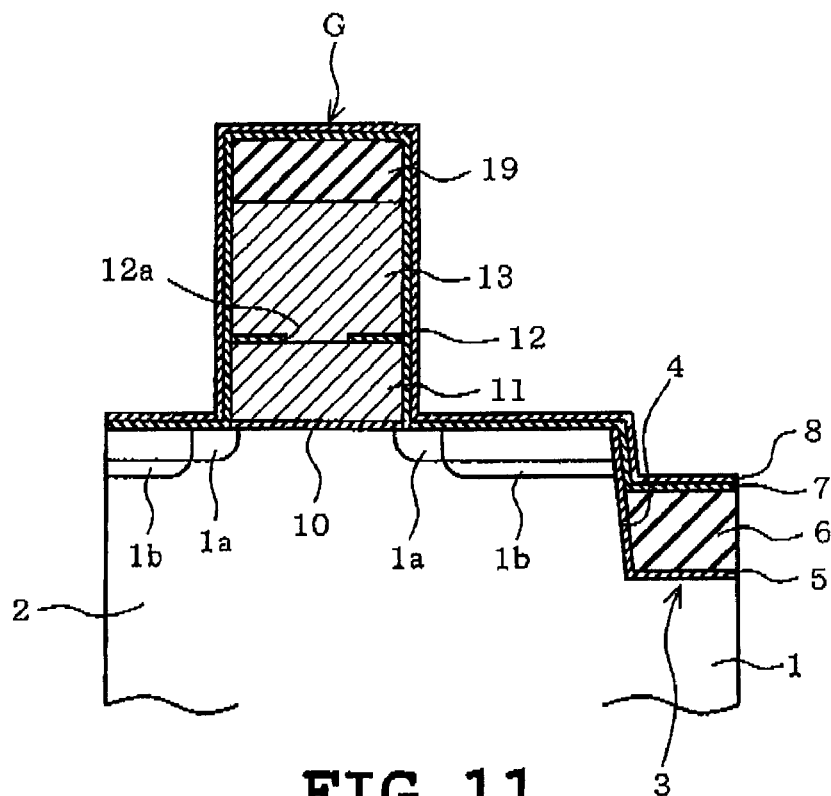
FIG. 11 schematically depicts one phase of the manufacturing steps.

Next, referring to FIG. 11, TEOS oxide film 7 and silicon nitride film 8 are formed by LP-CVD so as to cover the upper and side surfaces of gate electrode G and on the upper surfaces of active region 2 and SOG film 6.

Figure 12:
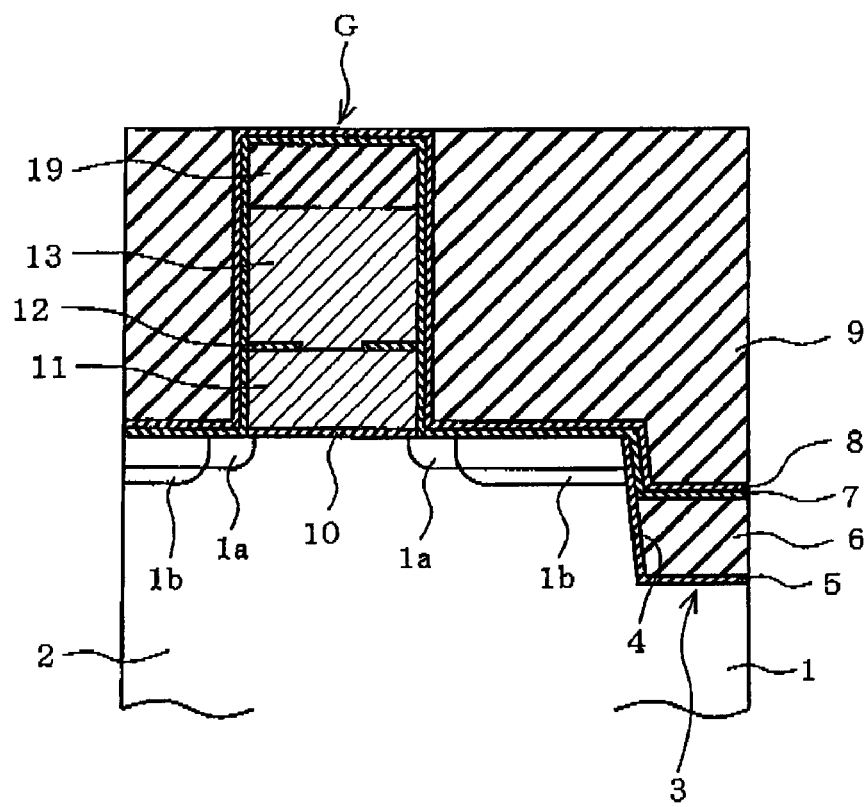
FIG. 12 schematically depicts one phase of the manufacturing steps.

Next, referring to FIG. 12, BPSG film 9 (non coating-type oxide film) is filled up to the upper surface of gate electrode G. BPSG film 9 being filled in the gaps between gate electrodes G by CVD and is treated by melt treatment to suppress occurrence of voids. Then, the structure is planarized by CMP using silicon nitride film 8 as a stopper to obtain the configuration illustrated in FIG. 12.

Figure 13:
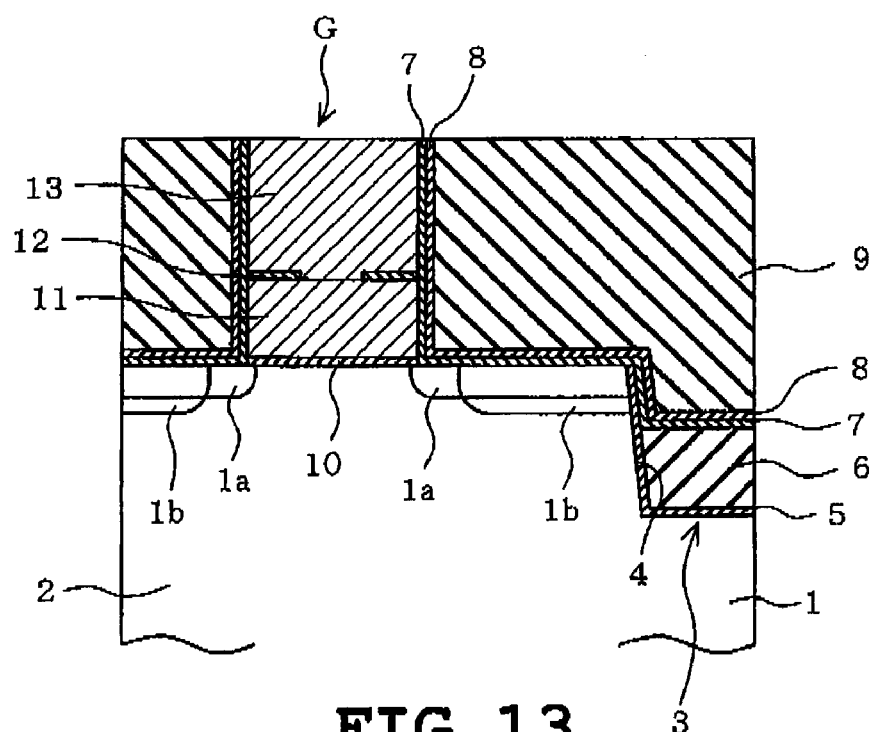
FIG. 13 schematically depicts one phase of the manufacturing steps.

Next, referring to FIG. 13, silicon nitride film 8, TEOS oxide film 7 and silicon nitride film 19 are removed as well as etching back BPSG film 9 to expose the upper surface of polycrystalline silicon film 13 of gate electrode G. FIG. 13 shows the upper surface of BPSG film 9 being flush with the upper surface of polycrystalline silicon film 13, however; polycrystalline silicon film 13 may be formed higher than the upper surface of BPSG film 9.

Figure 14:
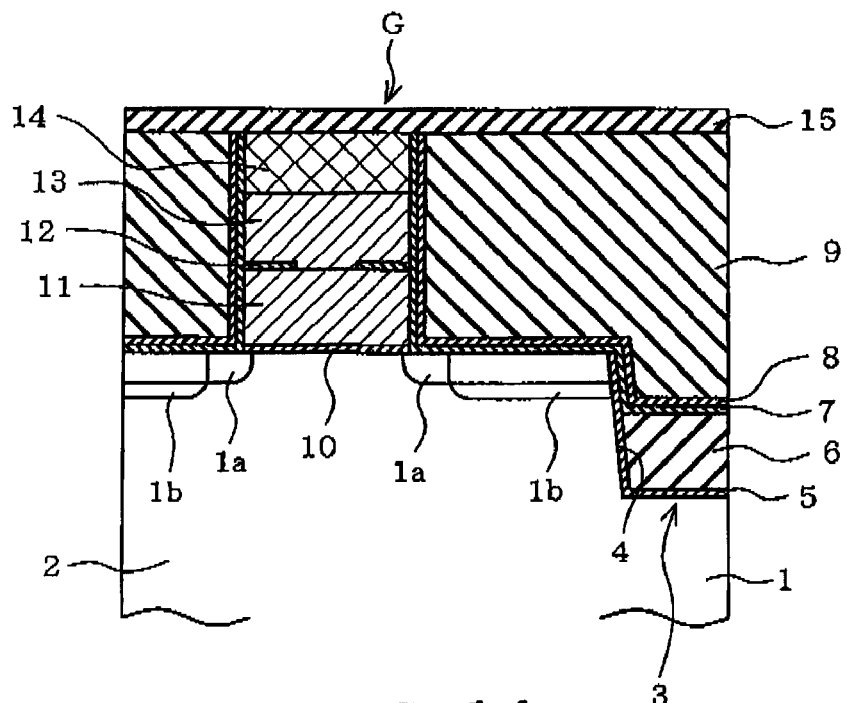
FIG. 14 schematically depicts one phase of the manufacturing steps.

Next, referring to FIG. 14, after silicidation of the upper portion of polycrystalline silicon film 13 into cobalt silicide layer 14, the structure is entirely covered by silicon nitride film 15 formed as a barrier film. Cobalt silicide layer 14 is formed by succession of steps comprising cleaning the surface of polycrystalline silicon film 13 shown in FIG. 13 by wet etching, formation of a cobalt film, and thermal treatment to cause silicidation effected by reaction of cobalt film with the underlying polycrystalline silicon film 13. After silicidation, non-reactive cobalt film is removed and silicon nitride film 15 is formed as a barrier film to prevent contamination originating form cobalt silicide layer 14.

Figure 15:
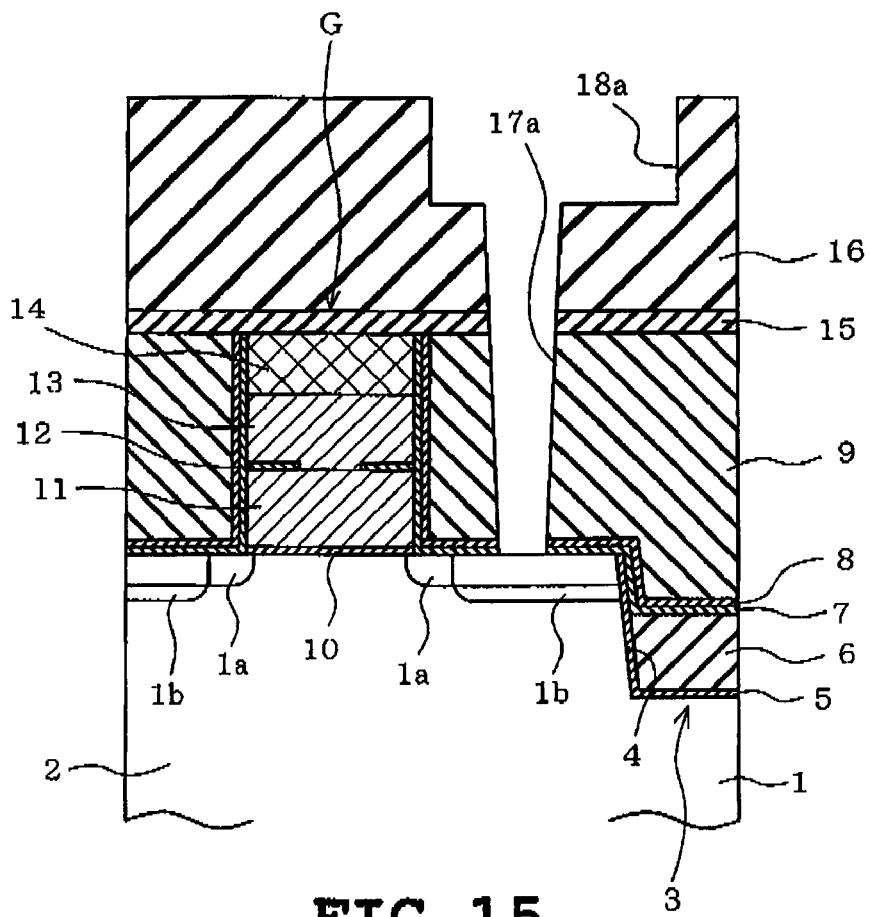
FIG. 15 schematically depicts one phase of the manufacturing steps.

Next, referring to FIG. 15, 400 nm of TEOS oxide film 16 constituting an interlayer insulating film is formed by CVD. Then, contact plugs 17 taking a dual damascene structure and interconnect layers 18 are formed thereafter. By photolithography process, more specifically, by RIE, contact hole 17a and interconnect layer 18 are formed in TEOS oxide film 16. Then, as shown in FIG. 1, contact hole 17a and interconnect trench 18a are filled with conductive material to form contact plug 17 and interconnect layer 18. The conductive material comprises laminated layers of Ti/TiN formed by CVD to serve as a barrier metal and tungsten (W) formed by CVD to fill the remaining space inside contact hole 17a and interconnect trench 18a. The configuration illustrated in FIG. 1 is obtained by the above described process. Though not shown the manufacturing steps subsequently proceed to multi-layer interconnect process of the upper layers.

The above described manufacturing steps suppress dislocation originating from crystal defects which are frequently caused by RTA performed after ion implantation for forming high-concentration impurity regions. Junction leak current characteristic is thus maintained at a fair level. More specifically, since RTA treatment after ion implantation is performed after lowering SOG film 6 in element isolation region 3 to depth H2 (H2>d2), the influence of strain originating from SOG film 6 on active region 2 can be relaxed.

FIGS. 17 to 22 illustrate a second exemplary embodiment of the present disclosure, which will be described focusing on portions that differ from the first exemplary embodiment. The present embodiment addresses another problem encountered in the wet etching for lowering SOG film 6 constituting element isolation region 3 illustrated in FIG. 10. The problem occurs when spacer 20, formed on the sidewalls of gate electrode G and being removed in the above described wet etching, is thin.

When spacer 20 is thin, spacer 20 is unwantedly removed before SOG film 6 is lowered during the wet etching. Under such state, when etching further progresses, the end surfaces of gate oxide film 10 situated between gate electrode G and silicon substrate 1 may be damaged by being placed in contact with etching solution. Thus, if sufficient thickness cannot be secured at spacer 20 due to constraints in pattern designing and processing steps, a solution is required to address this problem.

Figure 17:
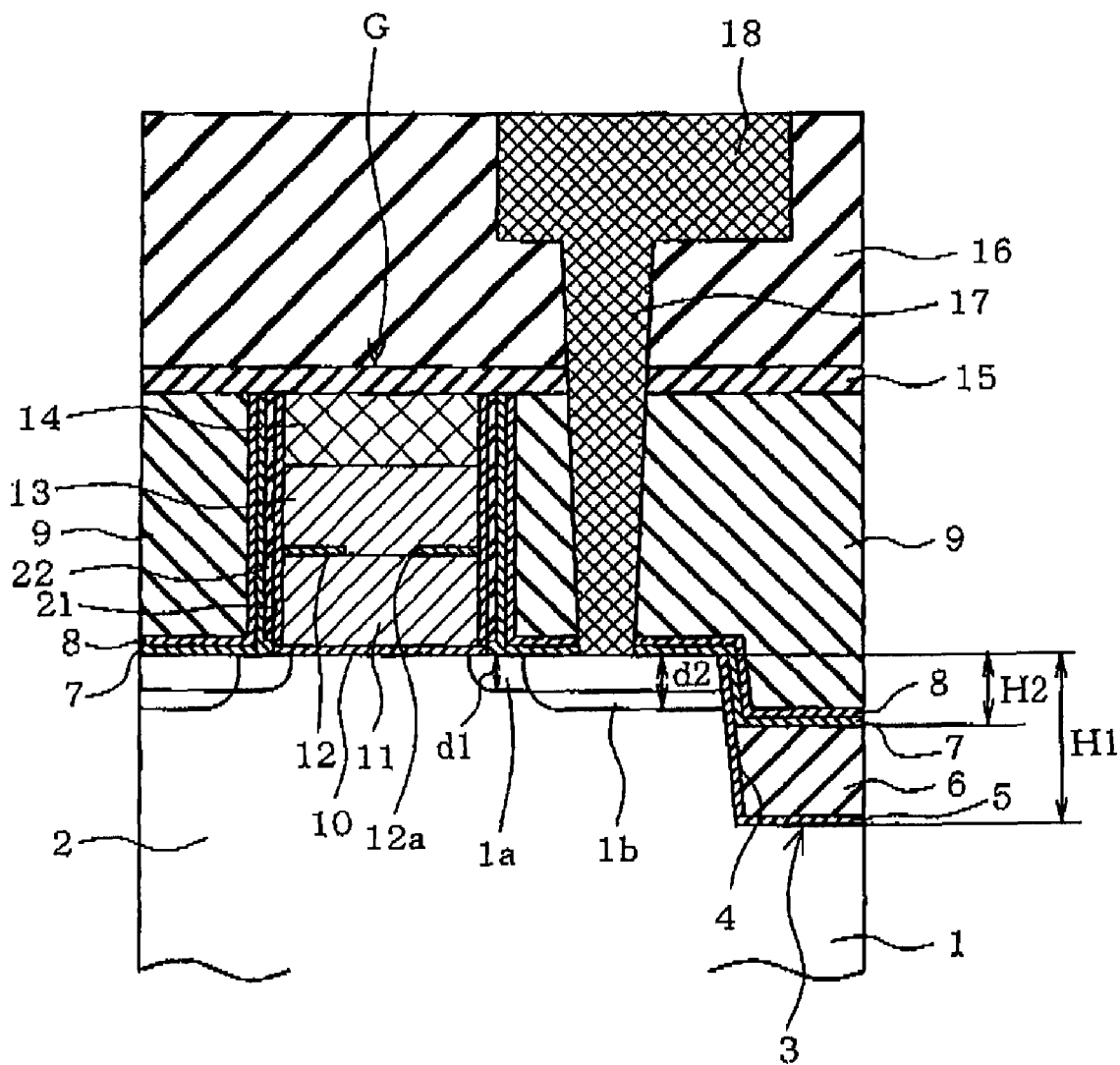
FIG. 17 is a schematic cross sectional view depicting a second exemplary embodiment of the present disclosure.

The present exemplary embodiment employs the underdescribed configuration to address this problem. Referring to FIG. 17, a silicon nitride film is additionally provided to prevent the spacer from being completely removed by the lowering of SOG film 6. The resulting configuration illustrated in FIG. 17 has an HTO (High Temperature Oxide) film 21 constituting a silicon oxide film formed on the sidewalls of gate electrode G and a silicon nitride film 22 further formed on HTO film 21. HTO film 21, initially being formed to entirely cover the sidewalls of gate electrode G is transformed by succession of manufacturing steps such that its upper end has an elevation substantially in alignment with the mid-portion of polycrystalline silicon film 13.

By employing the above described configuration, damaging of gate oxide film 10 by exposure to etching solution during the wet etching process can be prevented by silicon nitride film 22.

Figure 18:
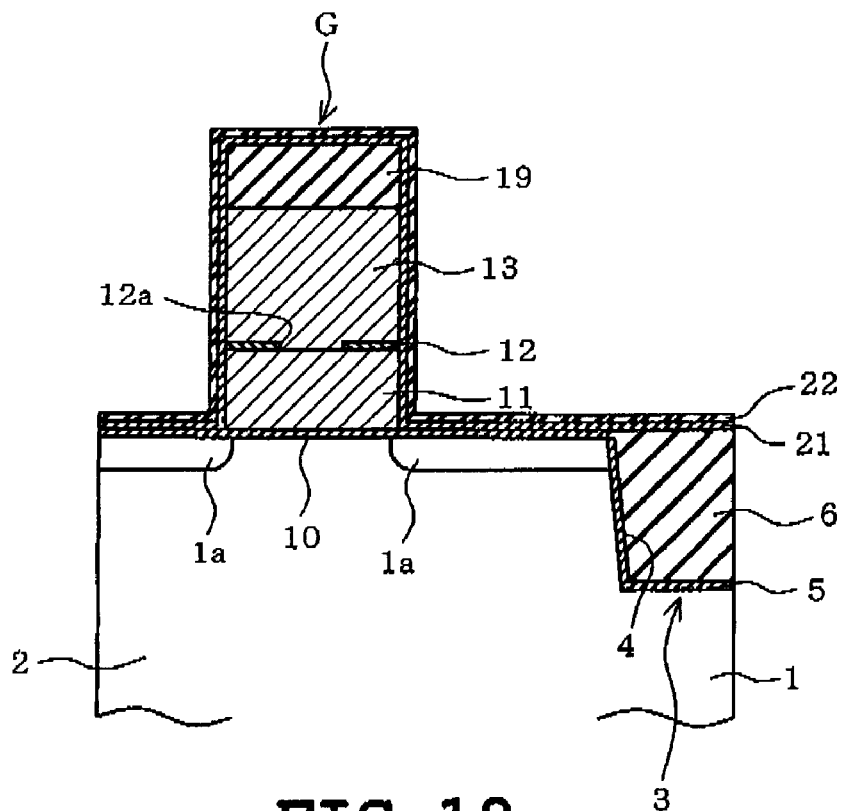
FIG. 18 schematically depicts one phase of the manufacturing steps.

Next, manufacturing steps of the above described configuration will be described with reference to FIGS. 18 to 22. After processing the gate electrodes as illustrated in FIG. 6 of the first exemplary embodiment, ion implantation is performed to form low-concentration impurity region 1a constituting the source/drain region as described in FIG. 7. Then, as illustrated in FIG. 18, HTO film 21 is laminated entirely over the upper and side surfaces of gate electrode G, the upper surface of silicon substrate 1, and the upper surface of SOG film 6.

Figure 19:
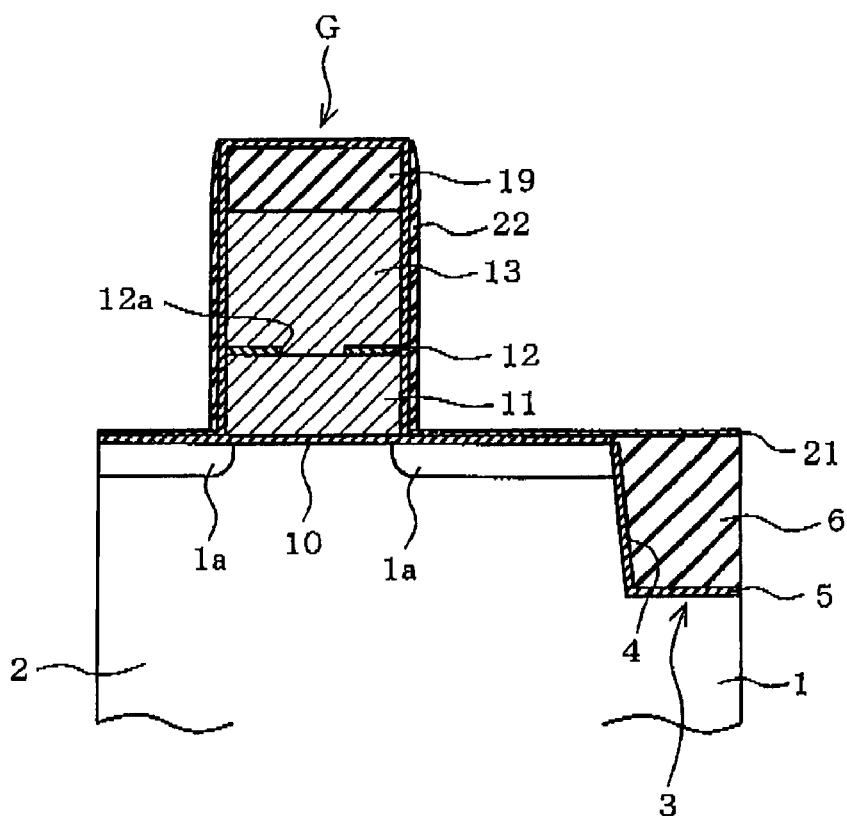
FIG. 19 schematically depicts one phase of the manufacturing steps.

Next, referring to FIG. 19, the linear silicon nitride film 22 is processed into a spacer. Thus, silicon nitride film 22 overlying the upper surface of gate electrode G, the upper surface of silicon substrate 1, and the upper surface of SOG film 6 is removed and silicon nitride film 22 on the sidewalls of gate electrode G remains in the form of a spacer. At this time, HTO film 21 overlying the upper surface of gate electrode G, the upper surface of silicon substrate 1, and the upper surface of SOG film 6 are slightly etched to be reduced in thickness.

Figure 20:
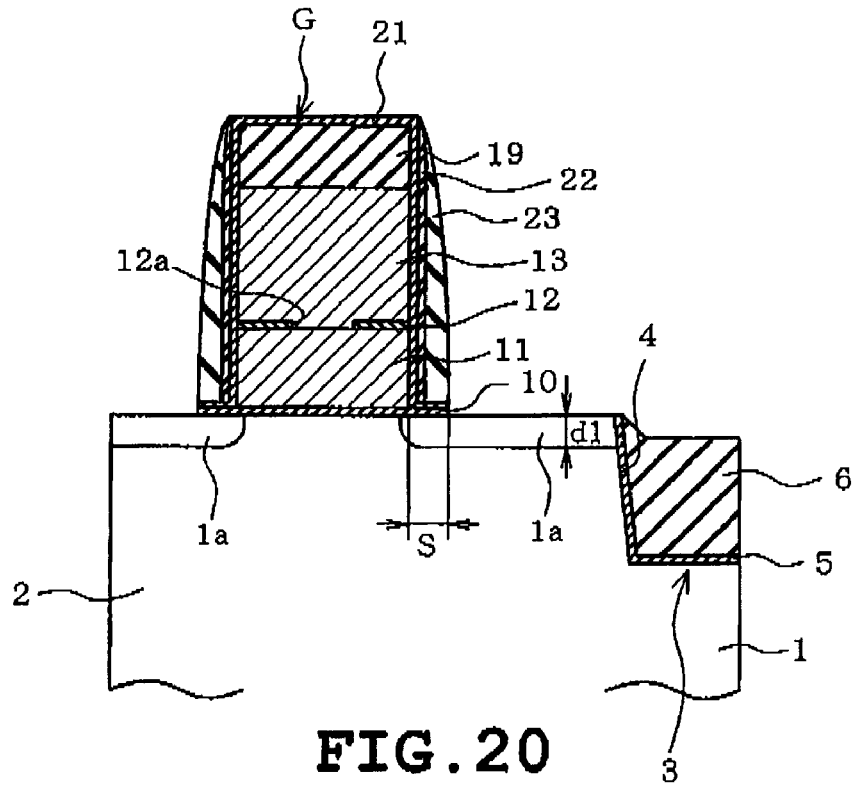
FIG. 20 schematically depicts one phase of the manufacturing steps.
Figure 21:
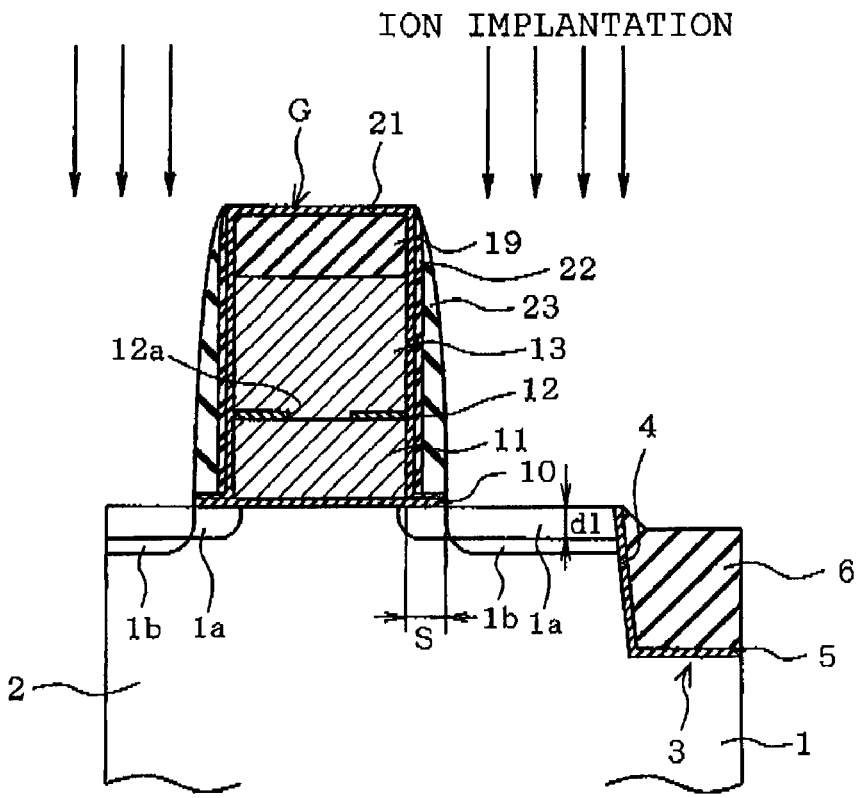
FIG. 21 schematically depicts one phase of the manufacturing steps.

Next, referring to FIG. 20, a spacer 23 for forming the LDD structure on silicon substrate 1 is formed over the sidewalls of gate electrode G. Spacer 23 comprising TEOS oxide film being formed at constant width in a linear fashion to entirely cover the underlying surface, is thereafter formed by RIE.

Using spacer 23 as a mask, a high concentration of n-type impurities are introduced by ion implantation to form an n-type high-concentration impurity region 1b of the second concentration greater than the first concentration on active region 2 exclusive of the region below gate electrode G and spacer 23. High-concentration impurity region 1b being identical in form as high-concentration impurity region 1b of the first embodiment also takes an LDD structure.

Figure 22:
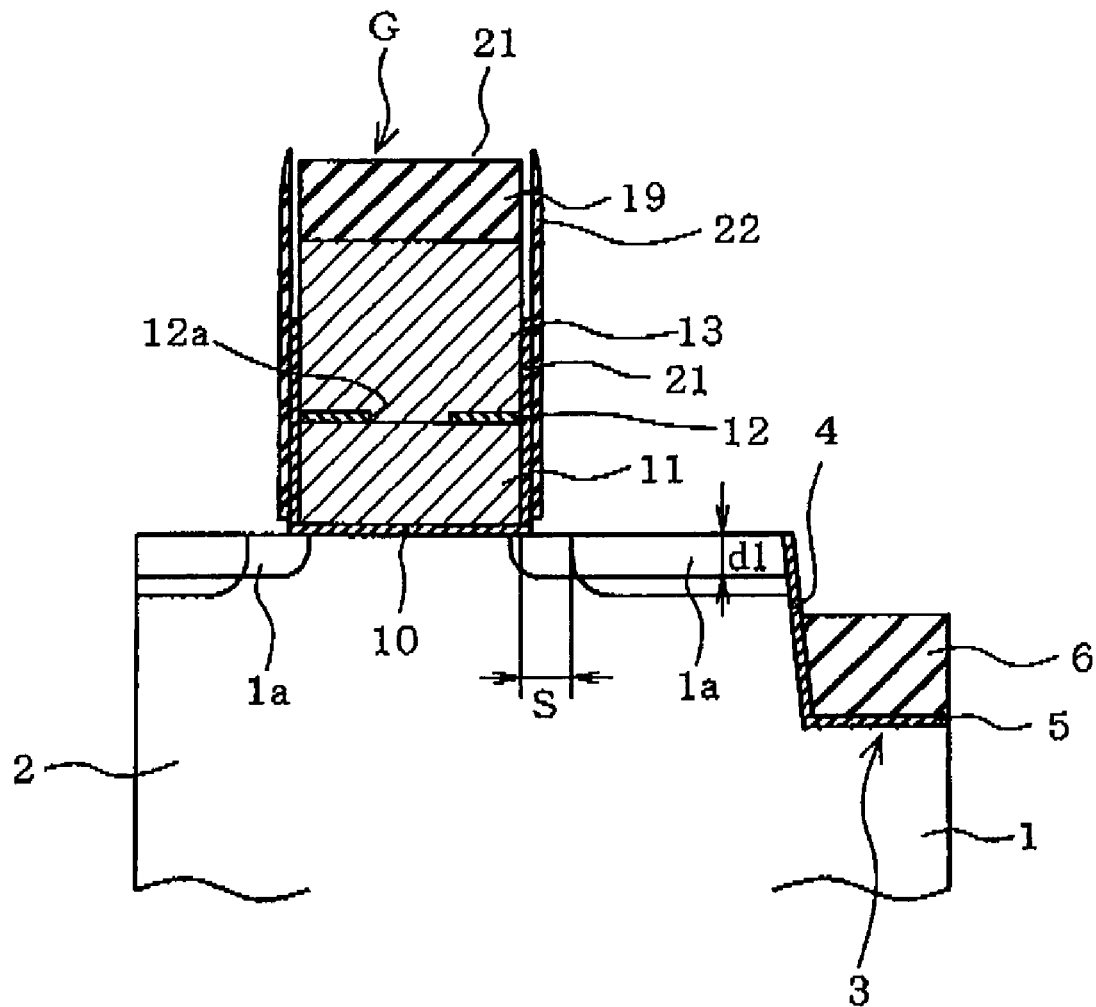
FIG. 22 schematically depicts one phase of the manufacturing steps.

Next, referring to FIG. 22, a resist is formed and patterned by photolithography so as to cover the regions where the memory cell transistors not shown are formed and regions where the peripheral circuit regions are formed are exposed. Using the resist as a mask, wet etching process is performed by fluorinated solutions to lower the upper surface of SOG film 6 to depth H2 from the upper surface of silicon substrate 1.

The wet etching also etches away spacer 23 made of TEOS oxide film, HTO film 21 formed on the upper surface of gate electrode G, and HTO film 21 and gate insulating film 10 situated below spacer 23 simultaneously. HTO film 21 formed on the sidewalls of gate electrode G is exposed to etching solution at its upper end portion uncovered by silicon nitride film 22 while wet etching is being performed for a predetermined time period to lower SOG film 6. Thus, etching progresses downward from the upper end portion of HTO film 21 to reduce the height of HTO film 21 to be substantially in alignment with the elevation of mid-portion of polycrystalline silicon film 13. However, silicon nitride film 22 provides reliable protection so that gate insulating film 10 below gate electrode G can be prevented from being etched.

Also, as observed in the first exemplary embodiment, etching process performed to lower SOG film 6 causes gate electrode G protruding into element isolation region 3 to be slightly etched away at the side surface situated immediately below silicon nitride film 22. Thus, at least the surface of high-concentration impurity region 1b exposed at the sidewall of active region 2 can be prevented from contacting SOG film 6. Also, by optimizing the amount of etch, low-concentration impurity region 1a may also be configured the same as the first exemplary embodiment.

Next, impurities introduced in low-concentration impurity region 1a and high-concentration impurity region 1b by ion implantation are treated by RTA (Rapid Thermal Annealing) to activate the impurity ions and for recovery of damaged crystals. Source/drain region of LDD structure is formed in active region 2 by the steps described above. Thus, the influence of strong stress produced by SOG film 6 can be reduced during thermal treatment since SOG film 6 is lowered away from impurity diffusion regions 1a and 1b as described above. As a result, dislocation originating from RTA can be suppressed to maintain a fair level of pn junction leak current characteristics.

As described in the first exemplary embodiment, by performing steps FIGS. 11 to 15, the configuration illustrated in FIG. 17 can be obtained.

The above described process, forming silicon nitride film 22 on the sidewalls of gate electrode G, allows wet etching for lowering SOG film 6 comprising coating-type oxide film to be performed without damaging gate oxide film 10 of gate electrode G even when thin spacer 23 needs to be formed, to provide improvement in manufacturing capabilities.

FIGS. 23 to 26 illustrate a third exemplary embodiment. Description will be given on the portions that differ from the first exemplary embodiment. The third exemplary embodiment shares the objective of the second embodiment in that damaging of gate oxide 10 immediately below gate electrode G is prevented even when a thin spacer is formed on the sidewall of gate electrode G for forming LDD structure.

Figure 23:
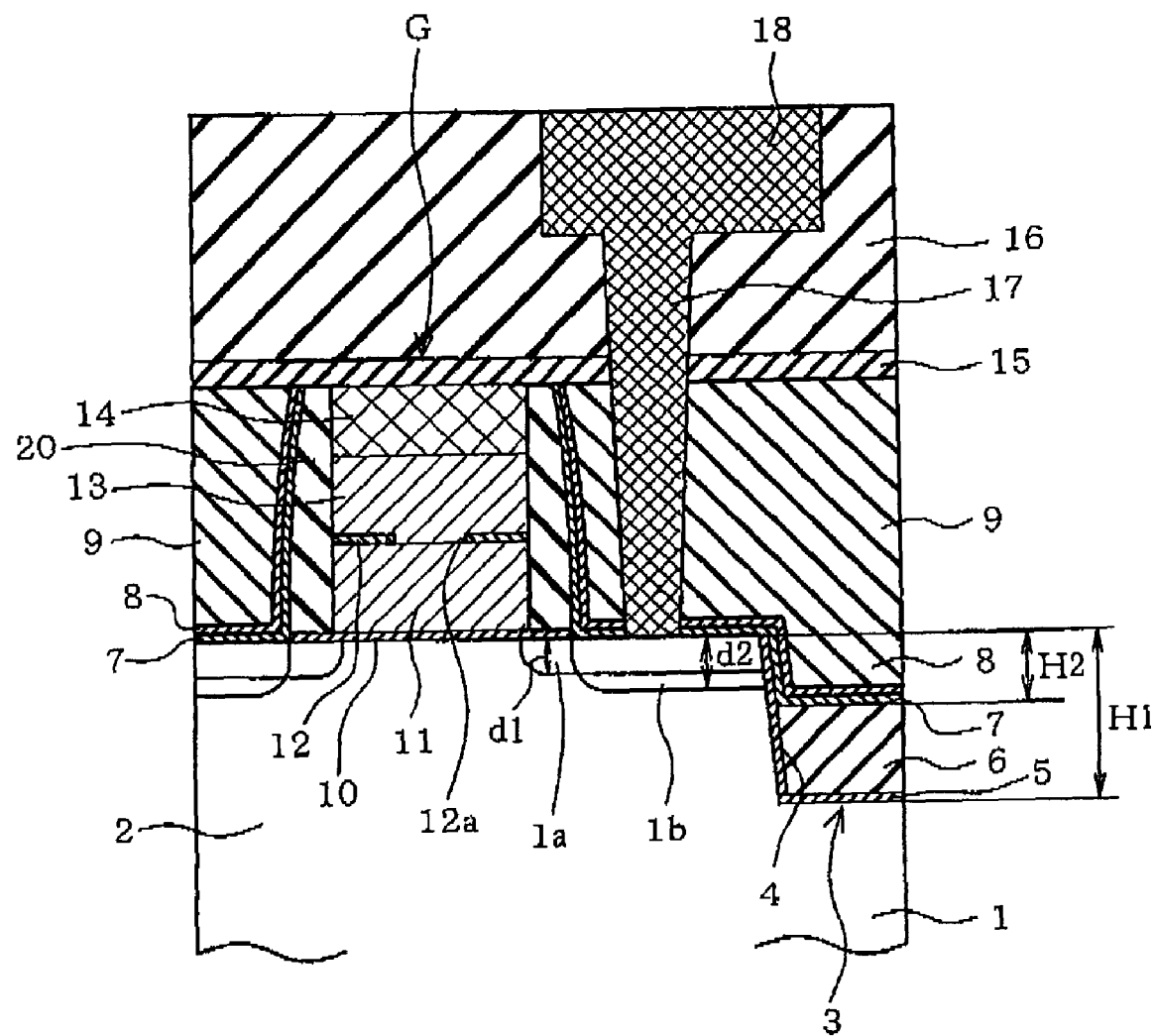
FIG. 23 is a schematic cross sectional view depicting a third exemplary embodiment of the present disclosure.

FIG. 23 shows spacer 20 used in forming LDD structure remaining on the sidewalls of gate electrode G. TEOS oxide film 7 and silicon nitride film 8 are formed on the sidewall surfaces of gate electrode G via spacer 20. Thus, gate insulating film 10, situated immediately below gate electrode G, is free from damages by the protection provided by spacer 20.

Figure 24:
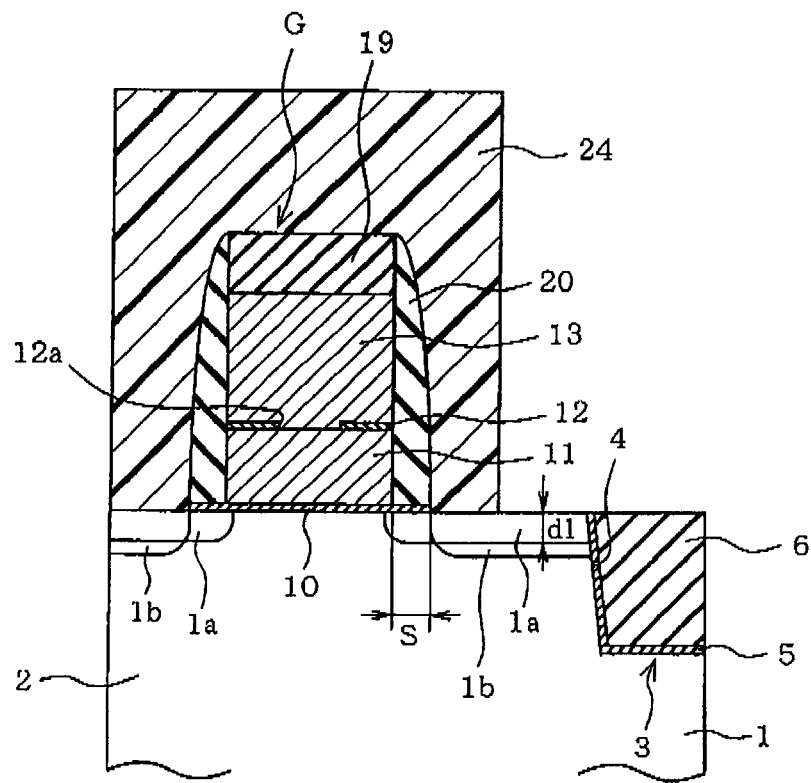
FIG. 24 schematically depicts one phase of the manufacturing steps.
Figure 25:
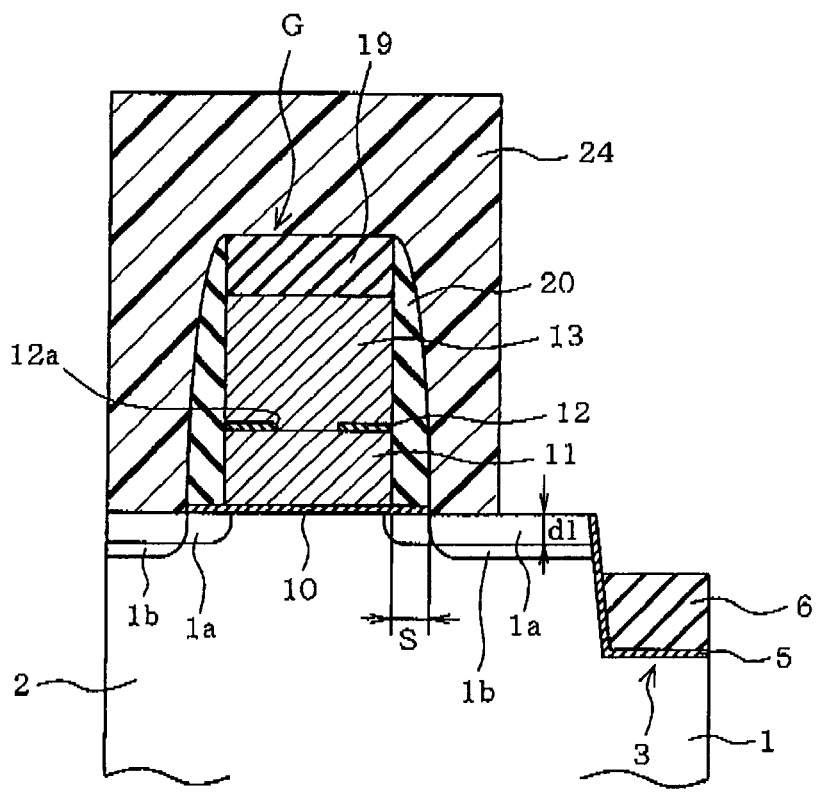
FIG. 25 schematically depicts one phase of the manufacturing steps.
Figure 26:
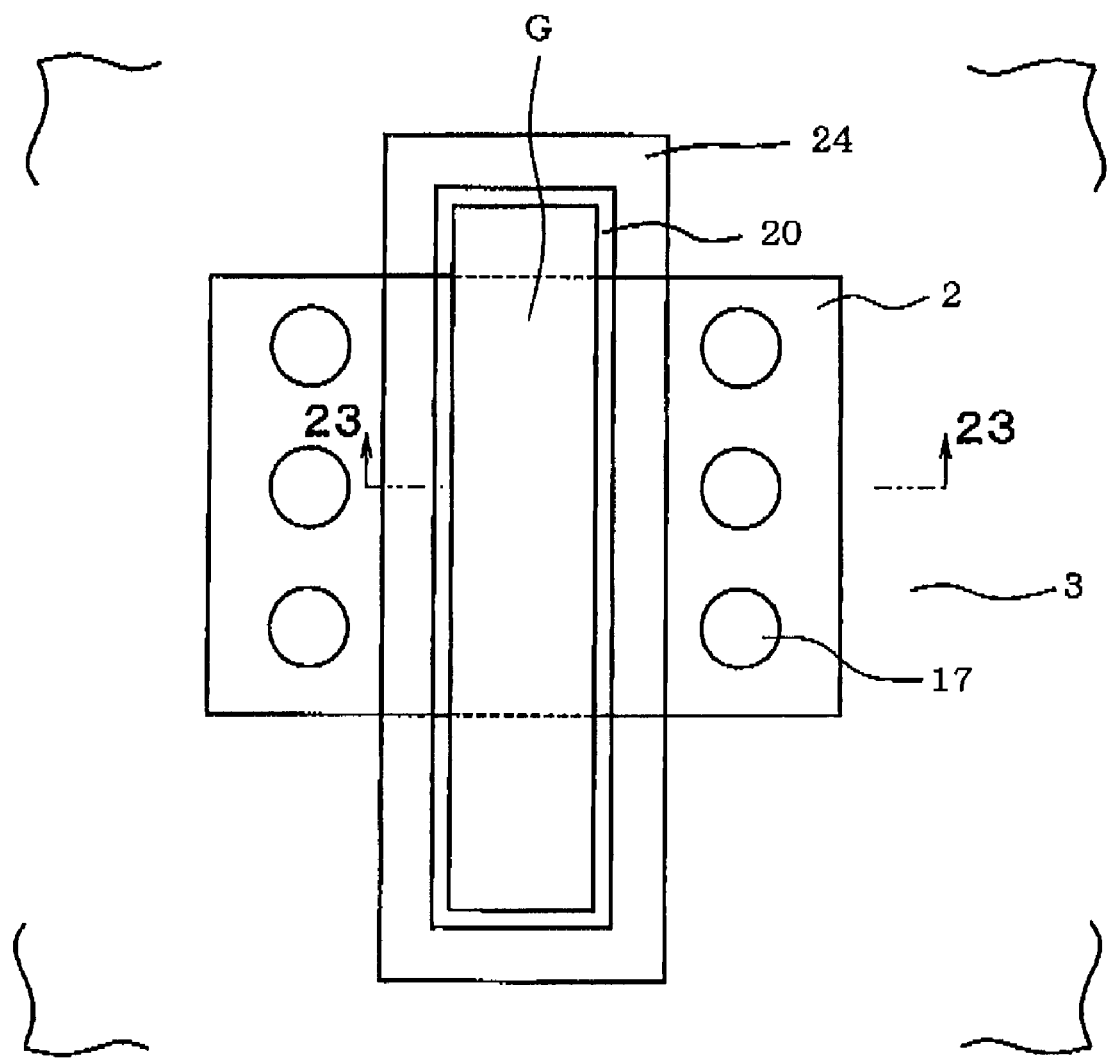
FIG. 26 is a schematic plan view.

FIGS. 24 to 26 illustrate the steps that differ from the first exemplary embodiment. FIG. 24 corresponds to a step subsequent to the step illustrated in FIG. 9. FIG. 9 shows high-concentration impurity region 1b being formed to form LDD structure by spacer 20 assisted ion implantation. Then, prior to wet-etching for lowering SOG film 6, a resist pattern 24 is formed so as to cover gate electrode G and spacer 20 as well as shown in FIG. 24, as opposed to the first exemplary embodiment in which resist pattern was formed to cover the memory cell region.

Gate electrode G, spacer 20, and resist pattern 24, when illustrated in planar view as in FIG. 2, are disposed as shown in FIG. 26. That is, spacer 20 is formed on the sidewalls of gate electrode G so as to surround the gate electrode G, and resist pattern 24 is formed so as to cover gate electrode G and spacer 20 in their entirety.

Next, referring to FIG. 25, using resist pattern 24 as a mask, SOG film 6 is lowered by wet-etching as described earlier. At this time, spacer 20 being covered by resist pattern 24 remains unetched. Thus, gate insulating film 10 being formed immediately below gate electrode G will suffer no damage by exposure to etching solution.

Then, after removing resist pattern 24, impurities introduced in low-concentration impurity region 1a and high-concentration impurity region 1b by ion implantation are treated by RTA (Rapid Thermal Annealing) to activate the impurity ions and for recovery of damaged crystals. Source/drain region of LDD structure is formed in active region 2 by the steps described above. Thus, the influence of strong stress produced by strains occurring at SOG film 6 can be reduced during thermal treatment since SOG film 6 is lowered away from impurity diffusion regions 1a and 1b as described above. As a result, dislocation originating from RTA can be suppressed to maintain a fair level of pn junction leak current characteristics.

Then, through steps indicated in FIGS. 11 to 15 described in the first exemplary embodiment, the configuration illustrated in FIG. 23 can be obtained.

The present disclosure is not limited to the above described exemplary embodiments but can be modified or expanded as follows.

Depth H2 of lowering SOG film 6 is dependent upon depth d2 determined by the parameters applied in impurity ion implantation in forming high-concentration impurity region 1b. Thus, depth H2 may be of any given depth as long as the depth of the upper surface of SOG film 6 is greater than depth d2.

The above given descriptions are based on the assumption that peak concentration of impurity distribution of high-concentration impurity region 1b is located at depth d2. However, the actual location of peak concentration is slightly increased in depth after RTA treatment succeeding ion implantation. In reality, the depth of peak concentration of impurities after ion implantation and distribution of peak concentration of impurities after diffusion anneal do not match. Since diffusion anneal after ion implantation is being performed at lower temperatures nowadays by requirements of device integration, depth of peak concentration after ion implantation and after diffusion anneal are substantially the same, though slightly different.

The oxide film formed in trench 4 may be not only HTO film 5 but an HDP (High Density Plasma) oxide film, an ALD (Atomic Layer Deposition) oxide film or an NSG (Non-Doped Silicate Glass) oxide film.

The foregoing description and drawings are merely illustrative of the principles of the present disclosure and are not to be construed in a limited sense. Various changes and modifications will become apparent to those of ordinary skill in the art. All such changes and modifications are seen to fall within the scope of the disclosure as defined by the appended claims.

What is claimed is:

1. A semiconductor device, comprising:
   a semiconductor substrate having an upper surface;
   an element isolation region including a plurality of trenches being formed in the semiconductor substrate along a first direction and a second direction crossing the first direction, the trench having a sidewall and a bottom surface located at a first depth and being filled with an element isolation insulating film;
   an element forming region formed on the semiconductor substrate, the element forming region being surrounded by the element isolation region;
   a gate electrode formed along the first direction on the element forming region via a gate insulating film, the gate electrode extending over the element isolation insulating film filled in the trenches extending along the second direction;
   a source/drain region formed in a portion of the element forming region located beside the gate electrode; the source/drain region having a second depth less than the first depth, and having an exposed surface exposed to the sidewall of the trench;
   a first silicon oxide film formed on a sidewall of the gate electrode;
   a first silicon nitride film constituting a spacer formed on the first silicon oxide film;
   a second silicon oxide film formed on the first silicon nitride film, on an upper surface of the source/drain region, and on an upper surface of the element isolation insulating film; and
   a second silicon nitride film formed on the second oxide film;
   wherein an upper surface of the element isolation insulating film exclusive of a portion underlying the gate electrode is located at a third depth greater than the second depth and less than the first depth so that the exposed surface of the source/drain region does not contact the element isolation insulating film.

2. A semiconductor device, comprising:
   a semiconductor substrate having an upper surface;
   an element isolation region including a plurality of trenches being formed in the semiconductor substrate along a first direction and a second direction crossing the first direction, the trench having a sidewall and a bottom surface located at a first depth and being filled with an element isolation insulating film;
   an element forming region formed on the semiconductor substrate, the element forming region being surrounded by the element isolation region;

a gate electrode formed along the first direction on the element forming region via a gate insulating film, the gate electrode extending over the element isolation insulating film filled in the trenches extending along the second direction;

a source/drain region formed in a portion of the element forming region located beside the gate electrode; the source/drain region having a second depth less than the first depth, and having an exposed surface exposed to the sidewall of the trench;

a first silicon oxide film formed on a sidewall of the gate electrode;

a first silicon nitride film constituting a spacer formed on the first silicon oxide film;

a second silicon oxide film formed on the first silicon nitride film, on an upper surface of the source/drain region, and on an upper surface of the element isolation insulating film; and a second silicon nitride film formed on the second oxide film;

wherein an upper surface of the element isolation insulating film exclusive of a portion underlying the gate electrode is located at a third depth greater than the second depth and less than the first depth.

3. The device of claim 1, wherein the element isolation insulating film comprises a coating-type oxide film, the coating-type oxide film being formed on a non coating-type oxide film formed on the sidewall and the bottom surface of the trench.

4. The device of claim 2, wherein the element isolation insulating film comprises a coating-type oxide film, the coating-type oxide film being formed on a non coating-type oxide film formed on the sidewall and the bottom surface of the trench.

5. The device of claim 3, wherein the non coating-type oxide film comprises an HDP (High Density Plasma) oxide film, an HTO (High Temperature Oxide) film, an ALD (Atomic Layer Deposition) oxide film or an NSG (Non-Doped Silicate Glass) oxide film.

6. The device of claim 4, wherein the non coating-type oxide film comprises an HDP (High Density Plasma) oxide film, an HTO (High Temperature Oxide) film, an ALD (Atomic Layer Deposition) oxide film or an NSG (Non-Doped Silicate Glass) oxide film.

7. The device of claim 3, wherein the coating-type oxide film comprises polysilazane.

8. The device of claim 4, wherein the coating-type oxide film comprises polysilazane.

9. The device of claim 1, wherein a non coating-type oxide film comprising a CVD (Chemical Vapor Deposition) silicon oxide film is formed on the element isolation insulating film.

10. The device of claim 2, wherein a non coating-type oxide film comprising a CVD (Chemical Vapor Deposition) silicon oxide film is formed on the element isolation insulating film.

11. The device of claim 1, wherein a non coating-type oxide film comprising BPSG (Boro-Phospho-Silicate Glass) film is formed on the element isolation insulating film.

12. The device of claim 2, wherein a non coating-type oxide film comprising BPSG (Boro-Phospho-Silicate Glass) film is formed on the element isolation insulating film.

* * * * *